(12) United States Patent
Do

(10) Patent No.: US 10,985,272 B2
(45) Date of Patent: Apr. 20, 2021

(54) INTEGRATED CIRCUIT DEVICES INCLUDING VERTICAL FIELD-EFFECT TRANSISTORS

(71) Applicant: Samsung Electronics Co., Ltd., Suwon-si (KR)

(72) Inventor: Jung Ho Do, Hwaseong-si (KR)

(73) Assignee: Samsung Electronics Co., Ltd.

( * ) Notice: Subject to any disclaimer, the term of this patent is extended or adjusted under 35 U.S.C. 154(b) by 32 days.

(21) Appl. No.: 16/434,276

(22) Filed: Jun. 7, 2019

(65) Prior Publication Data

US 2020/0144417 A1 May 7, 2020

Related U.S. Application Data

(60) Provisional application No. 62/755,681, filed on Nov. 5, 2018.

(51) Int. Cl.

| | |
|---|---|
| *H01L 29/66* | (2006.01) |
| *H01L 29/78* | (2006.01) |
| *H01L 27/092* | (2006.01) |
| *H01L 29/417* | (2006.01) |
| *H01L 29/10* | (2006.01) |
| *H01L 29/423* | (2006.01) |
| *H01L 27/02* | (2006.01) |

(52) U.S. Cl.
CPC ...... *H01L 29/7827* (2013.01); *H01L 27/0207* (2013.01); *H01L 27/092* (2013.01); *H01L 29/1037* (2013.01); *H01L 29/41741* (2013.01); *H01L 29/42356* (2013.01)

(58) Field of Classification Search
CPC .......... H01L 29/7827; H01L 29/41741; H01L 29/42356
See application file for complete search history.

(56) References Cited

U.S. PATENT DOCUMENTS

| | | | |
|---|---|---|---|
| 7,821,039 B2 | 10/2010 | Tien et al. | |
| 9,483,600 B2 | 11/2016 | Bansal et al. | |
| 9,786,645 B2 | 10/2017 | Yang | |
| 10,074,570 B2 | 9/2018 | Anderson et al. | |
| 2017/0309616 A1* | 10/2017 | Anderson | ....... H01L 21/823475 |
| 2017/0317211 A1* | 11/2017 | Kim | ..................... H01L 29/7827 |
| 2018/0075182 A1 | 3/2018 | Zhuang et al. | |
| 2018/0113975 A1 | 4/2018 | Sherazi et al. | |
| 2018/0190670 A1 | 7/2018 | Ryckaert et al. | |
| 2018/0211947 A1 | 7/2018 | Chu et al. | |
| 2019/0157261 A1* | 5/2019 | Balakrishnan | .... H01L 21/82385 |
| 2019/0378764 A1* | 12/2019 | Cheng | ............... H01L 29/41791 |

* cited by examiner

*Primary Examiner* — Phuc T Dang
(74) *Attorney, Agent, or Firm* — Myers Bigel, P.A.

(57) ABSTRACT

Integrated circuit devices including standard cells are provided. The standard cells may a first vertical field effect transistor (VFET) having a first conductivity type, a second VFET having a second conductivity type, and a third VFET having the first conductivity type. The first VFET may include a first channel region protruding from a substrate, and the first channel region has a first length. The second VFET may include a second channel region protruding from the substrate, and the second channel region has a second length. The third VFET may include a third channel region protruding from the substrate. The first channel region, the second channel region, and third channel region may be spaced apart from each other and may be sequentially arranged along a direction, and the second length may be greater than 1.5 times the first length.

20 Claims, 24 Drawing Sheets

US 10,985,272 B2

INTEGRATED CIRCUIT DEVICES INCLUDING VERTICAL FIELD-EFFECT TRANSISTORS

CROSS-REFERENCE TO RELATED APPLICATION

This application claims priority to U.S. Provisional Application Ser. No. 62/755,681, entitled VFET HIGH PERFORMANCE STANDARD CELL DESIGN, filed in the USPTO on Nov. 5, 2018, the disclosure of which is hereby incorporated by reference herein in its entirety.

FIELD

The present disclosure generally relates to the field of electronics and, more particularly, to vertical field-effect transistor (VFET) devices.

BACKGROUND

VFET devices have been researched because of their high scalability. Further, interconnections between VFETs may be simpler than those between planar transistors.

SUMMARY

According to some embodiments of the present inventive concept, standard cells may include a first vertical field effect transistor (VFET) having a first conductivity type, a second VFET having a second conductivity type that is different from the first conductivity type, and a third VFET having the first conductivity type. The first VFET may include a first channel region protruding from a substrate in a vertical direction that is perpendicular to an upper surface of the substrate, and the first channel region has a first length in a first horizontal direction that is perpendicular to the vertical direction. The second VFET may include a second channel region protruding from the substrate in the vertical direction, and the second channel region has a second length in the first horizontal direction. The third VFET may include a third channel region protruding from the substrate in the vertical direction. The first channel region, the second channel region, and third channel region may be spaced apart from each other in the first horizontal direction and may be sequentially arranged along the first horizontal direction, and the second length may be greater than 1.5 times the first length.

According to some embodiments of the present inventive concept, standard cells may include a first vertical field effect transistor (VFET) including a first channel region protruding from a substrate in a vertical direction that is perpendicular to an upper surface of the substrate, a second VFET including a second channel region protruding from the substrate in the vertical direction, and a third VFET including a third channel region protruding from the substrate in the vertical direction. The first channel region, the second channel region, and third channel region may be spaced apart from each other in a first horizontal direction that is perpendicular to the vertical direction and may be sequentially arranged along the first horizontal direction. The standard cells may also include a first cell boundary adjacent the first VFET, and a second cell boundary adjacent the third VFET. The first cell boundary and the second cell boundary may be spaced apart from each other in the first horizontal direction. The second channel region may include a portion that is equidistant from each of the first cell boundary and the second cell boundary in the first horizontal direction.

According to some embodiments of the present inventive concept, standard cells may include a first vertical field effect transistor (VFET) including a first channel region protruding from a substrate in a vertical direction that is perpendicular to an upper surface of the substrate, a second VFET including a second channel region protruding from the substrate in the vertical direction, and a third VFET including a third channel region protruding from the substrate in the vertical direction. The first channel region, the second channel region, and third channel region may be spaced apart from each other in a first horizontal direction that is perpendicular to the vertical direction and are sequentially arranged along the first horizontal direction. The standard cells may also include a first bottom contact adjacent the first VFET and a second bottom contact adjacent the third VFET. The first bottom contact may extend along a first cell boundary and may be electrically connected to the first VFET. The second bottom contact may extend along a second cell boundary and is electrically connected to the third VFET. The first cell boundary and the second cell boundary may be spaced apart from each other in the first horizontal direction. The first bottom contact and the second bottom contact may be configured to receive a first power having a first voltage.

DETAILED DESCRIPTION

An integrated circuit device may include multiple standard cells, and multiple first power lines electrically connected to a first power having a first voltage (e.g., a drain voltage $V_{DD}$) and multiple second power lines electrically connected to a second power having a second voltage (e.g., a source voltage $V_{SS}$) may be provided to supply power to the standard cells. The first power lines and the second power lines may be alternately arranged. Some of the standard cells may be single height cells, and each of the single height cells may include a single first power line and a single second power line extending on its cell boundaries, respectively. To improve drive strength of transistors of standard cells, it may be considered to increase widths of transistors and/or numbers of transistors.

According to some embodiments of the present inventive concept, a standard cell may be a double height cell that includes a pair of first power lines or a pair of second power lines extending on its pair of cell boundaries to improve drive strength of transistors of the standard cell by increasing widths of transistors and/or numbers of transistors. A double height cell has a size about two times a size of a single height cell, and thus more transistors and/or bigger transistors can be included therein.

According to some embodiments of the present inventive concept, a standard cell may be, for example, an inverter, a 2-input NAND gate, a 3-input NAND gate, a 2-input NOR gate, a 3-input NOR gate, an And-Or inverter (AOI), an Or-And inverter (OAI), an XNOR gate, an XOR gate, a multiplexer (MUX), a latch, or a D-flip-flop.

Figure 1:
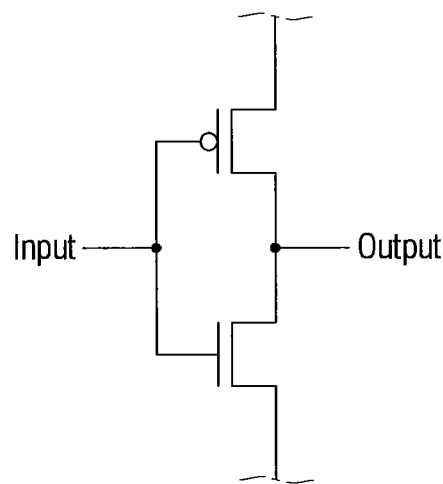
FIG. 1 is a circuit diagram of a portion of a standard cell according to some embodiments of the present inventive concept.
Figure 2:
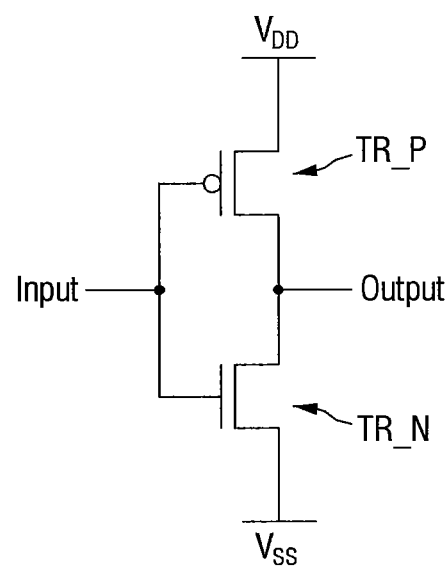
FIG. 2 is a circuit diagram of an inverter.

FIG. 1 is a circuit diagram of a portion of a standard cell, which includes one P-type transistor and one N-type transistor, which share a single output and a single input. According to some embodiments of the present inventive concept, the standard cell may be an inverter shown in FIG. 2. A first power having a first voltage (e.g., a drain voltage $V_{DD}$) may be applied to the P-type transistor TR_P of the inverter, and a second power having a second voltage (e.g., a source voltage $V_{SS}$) may be applied to the N-type transistor TR_N of the inverter.

Figure 3:
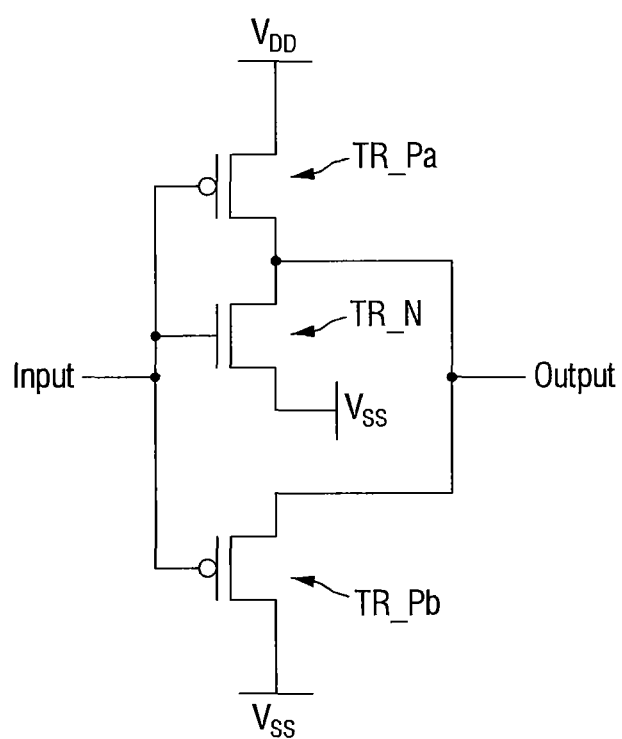
FIG. 3 is a circuit diagram of an inverter according to some embodiments of the present inventive concept.

To improve drive strength of transistors of an inverter, in some embodiments, an inverter may be designed to be a double height cell and may include two P-type transistors TR_Pa and TR_Pb, and a single N-type transistor TR_N, as illustrated in FIG. 3. In some embodiments, the N-type transistor TR_N may have a size bigger than that of each of the two P-type transistors TR_Pa and TR_Pb. For example, the N-type transistor TR_N may include a channel region longer than that of that of each of the two P-type transistors TR_Pa and TR_Pb.

Figure 4:
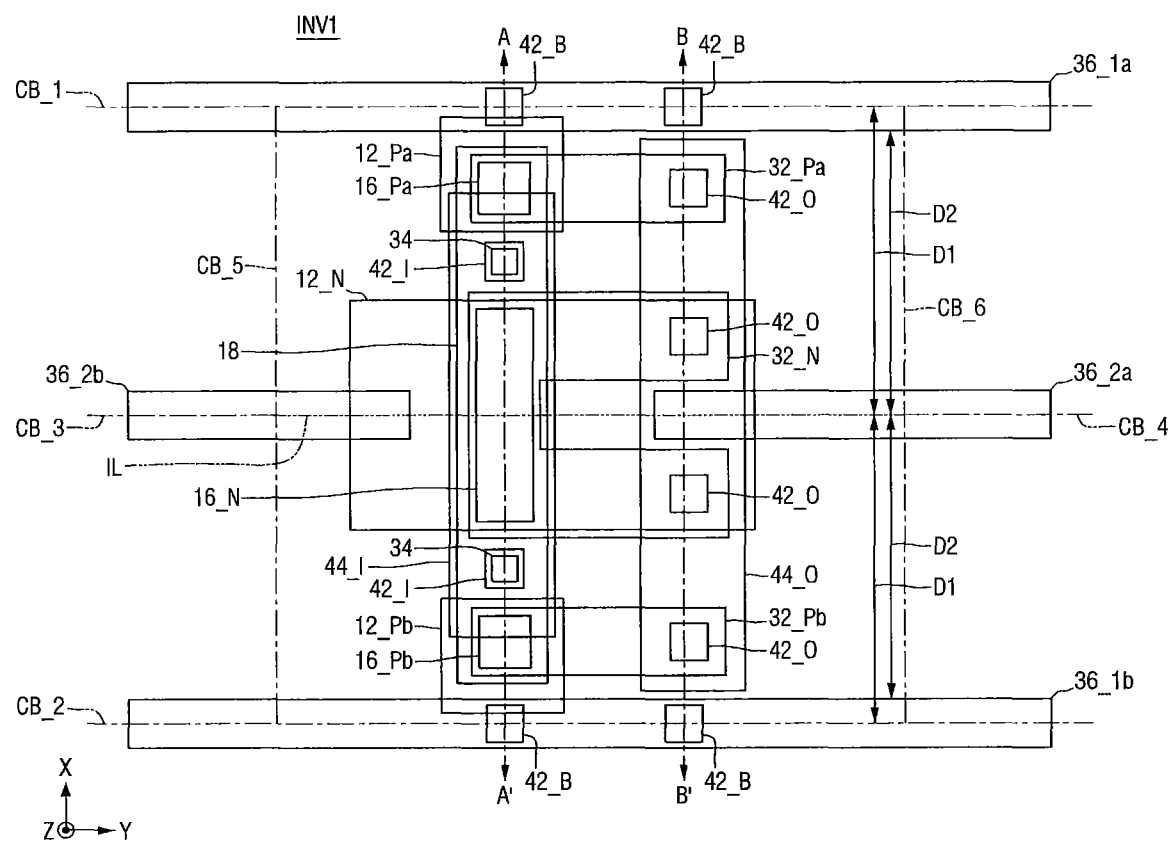
FIG. 4 is a layout of the inverter of FIG. 3 according to some embodiments of the present inventive concept.
Figure 5A:
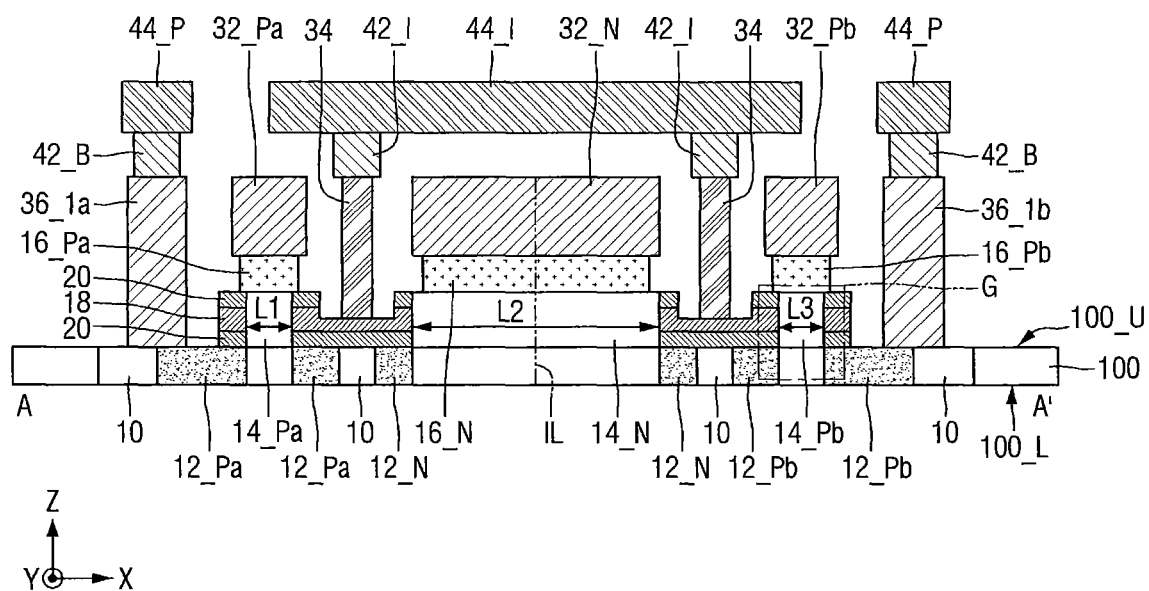
FIGS. 5A and 5B are cross-sectional views taken along the lines A-A' and B-B' of FIG. 4, respectively, according to some embodiments of the present inventive concept.
Figure 5B:
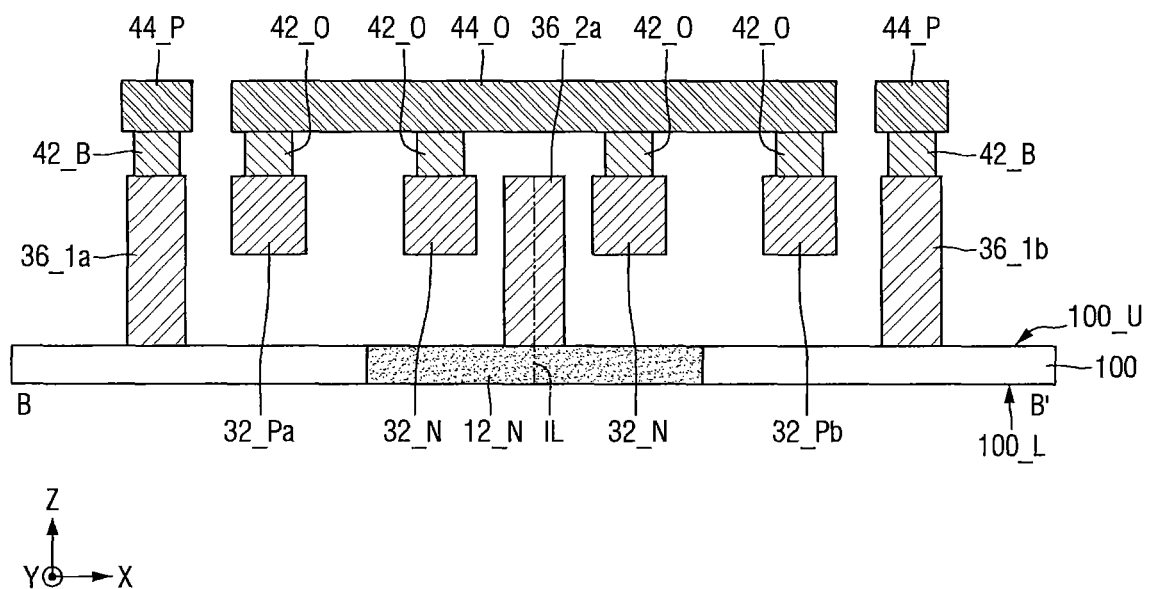

FIG. 4 is a layout of the inverter of FIG. 3 according to some embodiments of the present inventive concept, and FIGS. 5A and 5B are cross-sectional views taken along the lines A-A' and B-B' of FIG. 4, respectively, according to some embodiments of the present inventive concept.

Referring to FIGS. 4, 5A and 5B, an inverter (hereinafter "INV1") may include VFETs, such as a first P-type VFET TR_Pa, a second P-type VFET TR_Pb, and an N-type VFET TR_N shown in FIG. 3, provided on a substrate 100. The substrate 100 may include opposing surfaces, an upper surface 100_U and a lower surface 100_L. The upper surface 100_U and the lower surface 100_L of the substrate 100 may be parallel to each other. The substrate 100 may include one or more semiconductor materials, for example, Si, Ge, SiGe, GaP, GaAs, SiC, SiGeC and/or InP. In some embodiments, the substrate 100 may be a bulk substrate (e.g., a bulk silicon substrate) or a semiconductor on insulator (SOI) substrate.

The first P-type VFET TR_Pa may include a first bottom source/drain region 12_Pa in the substrate 100, a first channel region 14_Pa on the substrate 100, and a first top source/drain region 16_Pa on the first channel region 14_Pa. The first channel region 14_Pa may protrude from the upper surface 100_U of the substrate 100 in a vertical direction Z that is perpendicular to the upper surface 100_U of the substrate 100.

The N-type VFET TR_N may include a second bottom source/drain region 12_N in the substrate 100, a second channel region 14_N on the substrate 100, and a second top source/drain region 16_N on the second channel region 14_N. The second channel region 14_N may protrude from the upper surface 100_U of the substrate 100 in the vertical direction Z.

The second P-type VFET TR_Pb may include a third bottom source/drain region 12_Pb in the substrate 100, a third channel region 14_Pb on the substrate 100, and a third top source/drain region 16_Pb on the third channel region 14_Pb. The third channel region 14_Pb may protrude from the upper surface 100_U of the substrate 100 in the vertical direction Z. The INV1 may include isolation layers 10 (e.g., a shallow trench isolation layer) to electrically isolate the first bottom source/drain region 12_Pa, the second bottom source/drain region 12_N, and the third bottom source/drain region 12_Pb. The isolation layers 10 may include an insulating material (e.g., silicon dioxide).

In some embodiments, the first channel region 14_Pa, the second channel region 14_N, and the third channel region 14_Pb may be spaced apart from each other in a first horizontal direction X that is perpendicular to the vertical direction Z and may be sequentially arranged along the first horizontal direction X, as illustrated in FIG. 5A. The first channel region 14_Pa may have a first length L1 in the first horizontal direction X, the second channel region 14_N may have a second length L2 in the first horizontal direction X, and the third channel region 14_Pb may have a third length L3 in the first horizontal direction X. The second length L2 may be longer than the first length L1. For example, the second length L2 may be at least 1.5 times the first length L1, or the second length L2 may be greater than two times the first length L1. In some embodiments, the first length L1 may be equal to the third length L3.

The INV1 may include a common gate layer 18. A first portion of the common gate layer 18 may be a first gate electrode of the first P-type VFET TR_Pa, a second portion of the common gate layer 18 may be a second gate electrode of the N-type VFET TR_N, and a third portion of the common gate layer 18 may be a third gate electrode of the second P-type VFET TR_Pb. As the common gate layer 18 is shared by the first P-type VFET TR_Pa, the N-type VFET TR_N, and the second P-type VFET TR_Pb, an input of the INV1 may be applied through the common gate layer 18. Spacers 20 may be provided on and under the common gate layer 18.

The inverter INV1 may include a first bottom contact 36_1a adjacent the first P-type VFET TR_Pa and a second bottom contact 36_1b adjacent the second P-type VFET TR_Pb. The first bottom contact 36_1a and the second bottom contact 36_1b may be spaced apart from each other in the first horizontal direction X. The first bottom contact 36_1a and the second bottom contact 36_1b may extend along a first cell boundary CB_1 and a second cell boundary CB_2, respectively, which extend in a second horizontal direction Y that is perpendicular to the vertical direction Z and traverses the first horizontal direction X. In some embodiments, each of the first bottom contact 36_1a and the second bottom contact 36_1b may extend longitudinally in the second horizontal direction Y. In some embodiments, the second horizontal direction Y may be perpendicular to the first horizontal direction X.

In some embodiments, as illustrated in FIG. 4, each of the first bottom contact 36_1a and the second bottom contact 36_1b may continuously extend across the INV1. Further, each of the first bottom contact 36_1a and the second bottom contact 36_1b may extend into adjacent cells and may be shared with the adjacent cells. The first cell boundary CB_1 may be on a middle of the first bottom contact 36_1a in the first horizontal direction X, and the second cell boundary CB_2 may be on a middle of the second bottom contact 36_1b in the first horizontal direction X.

The first bottom contact 36_1a may be electrically connected to the first bottom source/drain region 12_Pa, and the second bottom contact 36_1b may be electrically connected to the third bottom source/drain region 12_Pb. In some embodiments, both of the first bottom contact 36_1a and the second bottom contact 36_1b may be connected to a first power having a first voltage (e.g., a drain voltage $V_{DD}$), and thus the first power may be applied to the first bottom source/drain region 12_Pa and the third bottom source/drain region 12_Pb. The first bottom contact 36_1a may contact the first bottom source/drain region 12_Pa, and the second bottom contact 36_1b may contact the third bottom source/drain region 12_Pb, as illustrated in FIG. 5A.

In some embodiments, the second channel region 14_N may extend across an imaginary line IL that is equidistant from each of the first and second cell boundaries CB_1 and CB_2 in the first horizontal direction X, and thus the second channel region 14_N may include a portion that is equidistant from each of the first and second cell boundaries CB_1 and CB_2, as illustrated in FIG. 5A. In some embodiments, a middle of the second channel region 14_N in the first horizontal direction X may be on the imaginary line IL. Third and fourth cell boundaries CB_3 and CB_4 of cells adjacent the INV1 in the second horizontal direction Y may be aligned with the imaginary line IL along the second horizontal direction Y, as illustrated in FIG. 4.

The INV1 may also include a third bottom contact 36_2a and a fourth bottom contact 36_2b, and the third bottom contact 36_2a may be electrically connected to the second bottom source/drain region 12_N. In some embodiments, the third bottom contact 36_2a may contact the second bottom source/drain region 12_N, as illustrated in FIG. 5B. In some embodiments, the third bottom contact 36_2a may be connected to a second power having a second voltage (e.g., a source voltage $V_{SS}$) that is different from the first voltage, and thus the second power may be applied to the second bottom source/drain region 12_N. As illustrated in FIG. 4, the third bottom contact 36_2a may not continuously extend across the INV1. In some embodiments, the fourth bottom contact 36_2b may also be electrically connected to the second bottom source/drain region 12_N.

Referring to FIG. 4, the third bottom contact 36_2a may traverse a sixth cell boundary CB_6 and may extend into an adjacent cell. Accordingly, the third bottom contact 36_2a of the INV1 may be shared with the adjacent cell. A middle of the third bottom contact 36_2a may be spaced apart from each of the first and second cell boundaries CB_1 and CB_2 by a first distance D1 in the first horizontal direction X, and thus the middle of the third bottom contact 36_2a may be equidistant from each of the first and second cell boundaries CB_1 and CB_2. In some embodiments, the middle of the third bottom contact 36_2a may be spaced apart from each of the first bottom contact 36_1a and the second bottom contact 36_1b by a second distance D2 in the first horizontal direction X, and thus the middle of the third bottom contact 36_2a may be equidistant from each of the first bottom contact 36_1a and the second bottom contact 36_1b.

The fourth bottom contact 36_2b may traverse a fifth cell boundary CB_5 and may extend into an adjacent cell. A middle of the fourth bottom contact 36_2b may also be spaced apart from each of the first and second cell boundaries CB_1 and CB_2 by the first distance D1 in the first horizontal direction X, and thus the middle of the fourth bottom contact 36_2b may be equidistant from each of the first and second cell boundaries CB_1 and CB_2.

Still referring to FIGS. 4, 5A, and 5B, the INV1 may include first top contacts 32_Pa and 32_Pb, a second top contact 32_N, gate contacts 34, first via contacts 42_I, second via contacts 42_O, a first conductive line 44_I, and a second conductive line 44_O. The common gate layer 18 may be electrically connected to the first conductive line 44_I through the gate contacts 34 and the first via contacts 42_I. The first and third top source/drain regions 16_Pa and 16Pb may be electrically connected to the second conductive line 44_O through the first top contacts 32_Pa and 32_Pb and the second via contacts 42_O. The second top source/drain region 16_N may be electrically connected to the second conductive line 44_O through the second top contact 32_N and the second via contacts 42_O. Although the two gate contacts 34 and the two first via contacts 42_I are shown, it will be understood that the inverter INV1 may include a single pair of the gate contact 34 and the first via contact 42_I.

Each of the first top contacts 32_Pa and 32_Pb, the second top contact 32_N, the gate contacts 34, the first via contacts 42_I, the second via contacts 42_O, the first conductive line 44_I, and the second conductive line 44_O may include metal, for example, cobalt (Co), tungsten (W), and/or copper (Cu).

The INV1 may further include third via contacts 42_B, and each of the third via contacts 42_B may be electrically connected to one of the first bottom contact 36_1a and the second bottom contact 36_1b. In some embodiments, each of the third via contacts 42_B may contact one of the first bottom contact 36_1a and the second bottom contact 36_1b, as illustrated in FIGS. 5A and 5B. The third via contacts 42_B may include metal, for example, Co, W, and/or Cu. Although omitted from view in FIG. 4, the INV1 may also include third conductive lines 44_P that may be electrically connected to some of the third via contacts 42_B, as illustrated in FIGS. 5A and 5B.

Figure 6A:
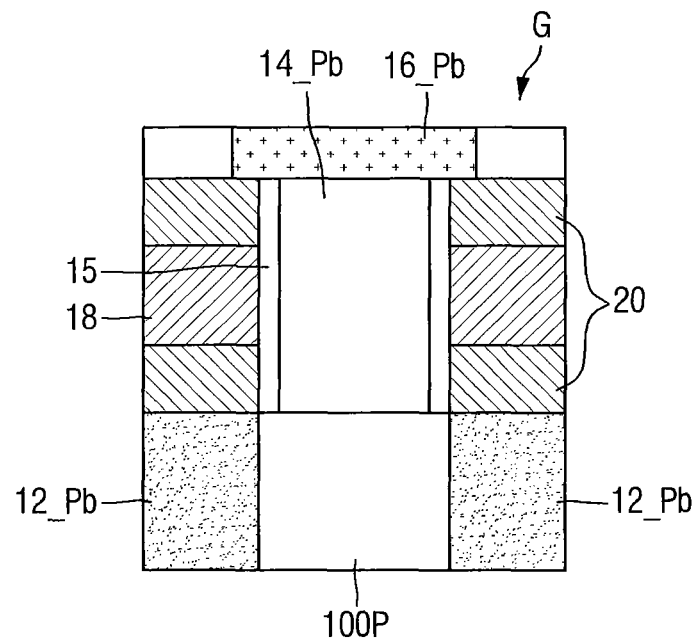
FIGS. 6A and 6B are enlarged views of the region G of FIG. 5A, according to some embodiments of the present inventive concept.
Figure 6B:
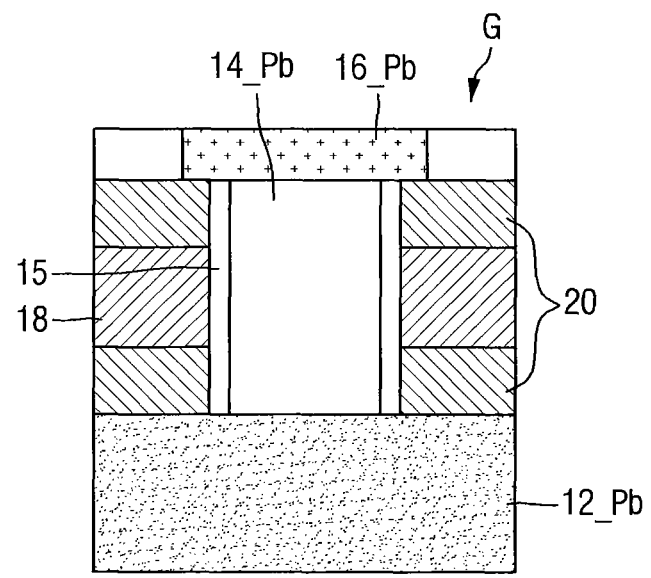

FIGS. 6A and 6B are enlarged views of the region G of FIG. 5A according to some embodiments of the present inventive concept. Referring to FIGS. 6A and 6B, a gate insulator 15 may be disposed between the third channel region 14_Pb and the common gate layer 18 to electrically isolate the third channel region 14_Pb and the common gate layer 18. Although FIGS. 6A and 6B show that the gate insulator 15 is also between the spacer 20 and the third channel region 14_Pb, it will be understood that the gate insulator 15 can be omitted between the spacer 20 and the third channel region 14_Pb, and the spacer 20 may contact the third channel region 14_Pb. In some embodiments, as illustrated in FIGS. 5A and 6A, a lower surface of the third channel region 14_Pb may be connected to the substrate 100 through a protruding portion 100P of the substrate 100, and the third bottom source/drain region 12_Pb may be on a side of the protruding portion 100P of the substrate 100. In some embodiments, a lower surface of the third channel region 14_Pb may vertically overlap the third bottom source/drain region 12_Pb, as illustrated in FIG. 6B. It will be understood that all VFETs discussed herein, including the first P-type VFET TR_Pa, the N-type VFET TR_N shown in FIG. 4, can have a structure the same as or similar to the second P-type VFET TR_Pb shown in FIGS. 6A and 6B.

Figure 7:
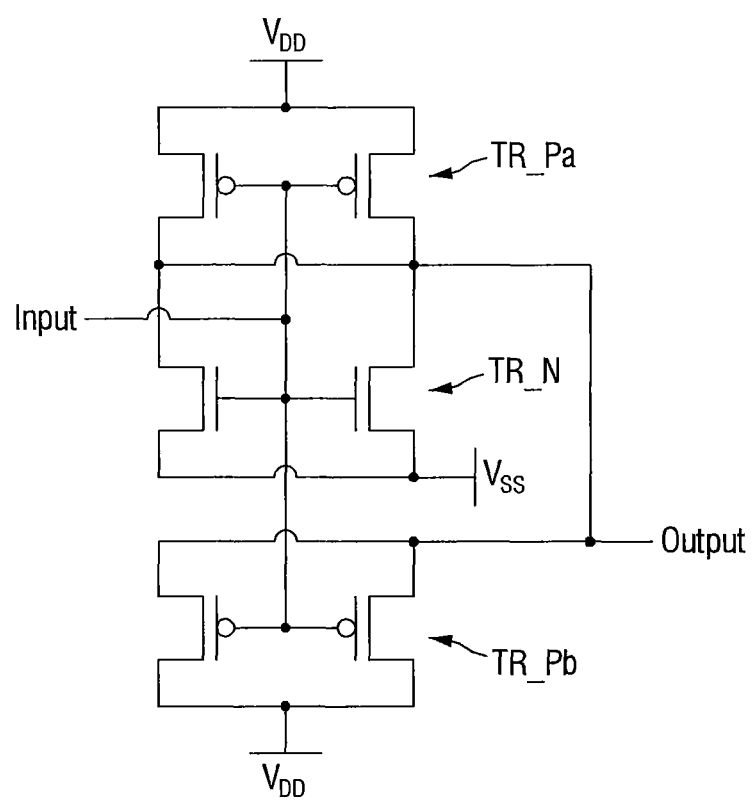
FIG. 7 is a circuit diagram of an inverter according to some embodiments of the present inventive concept.
Figure 8:
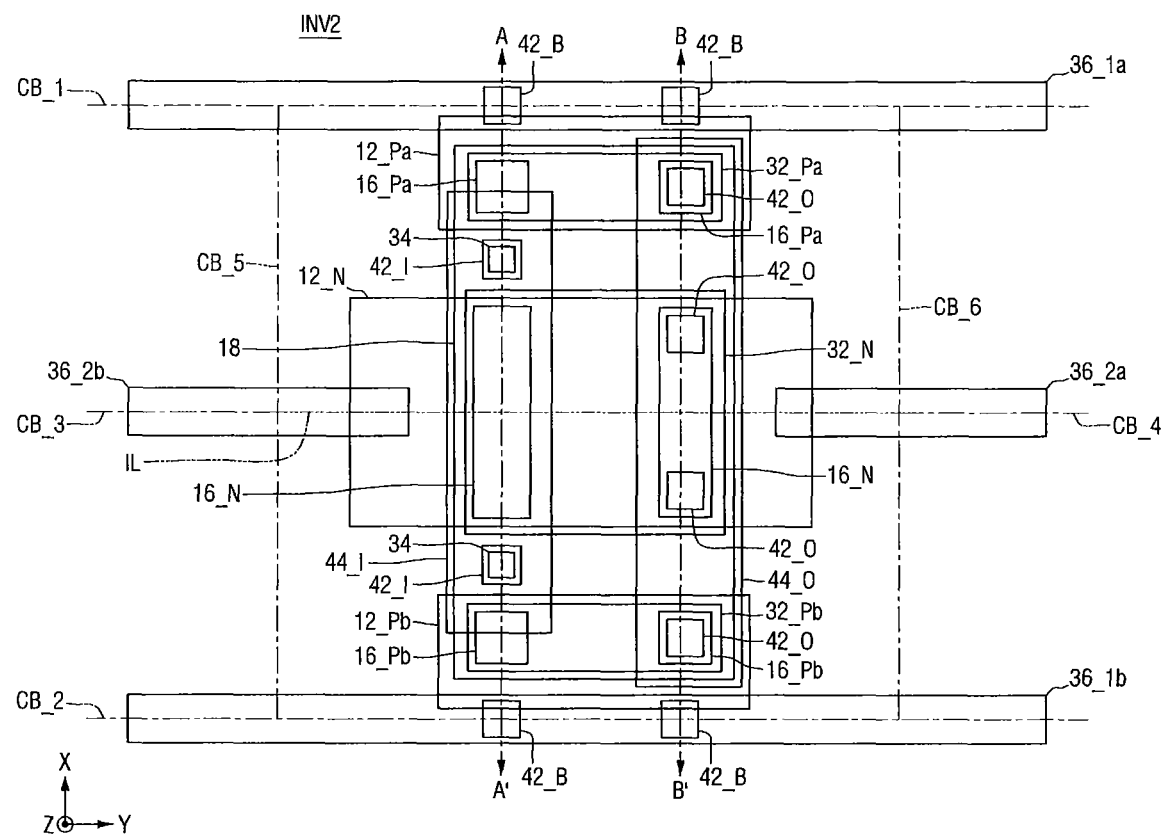
FIG. 8 is a layout of the inverter of FIG. 7 according to some embodiments of the present inventive concept.
Figure 9:
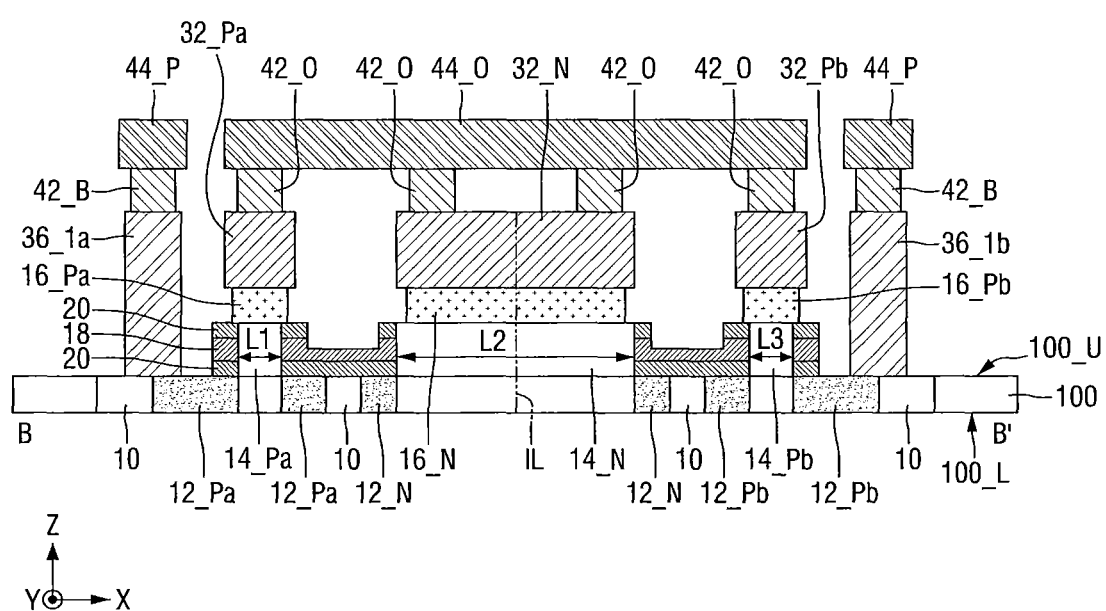
FIG. 9 is a cross-sectional view taken along the line B-B' of FIG. 8 according to some embodiments of the present inventive concept.

FIG. 7 is a circuit of an inverter (hereinafter "INV2") according to some embodiments of the present inventive concept. Referring to FIG. 7, each of the first P-type VFET TR_Pa, the second the first P-type VFET TR_Pb, and the N-type VFET TR_N of FIG. 3 may be modified to include two VFETs connected in parallel for better performance (e.g., higher transistor current). FIG. 8 is a layout of the INV2 of FIG. 7 according to some embodiments of the present inventive concept, and FIG. 9 is a cross-sectional view taken along the line B-B' of FIG. 8 according to some embodiments of the present inventive concept. A cross-sectional view taken along the line A-A' of FIG. 8 may be the same as or similar to the cross-sectional view shown in FIG. 5A. Except that each of the first P-type VFET TR_Pa, the second P-type VFET TR_Pb, and the N-type VFET TR_N includes two transistors, the INV2 may be the same as or similar to the INV1 discussed with reference to FIGS. 3, 4, 5A, and 5B.

Figure 10:
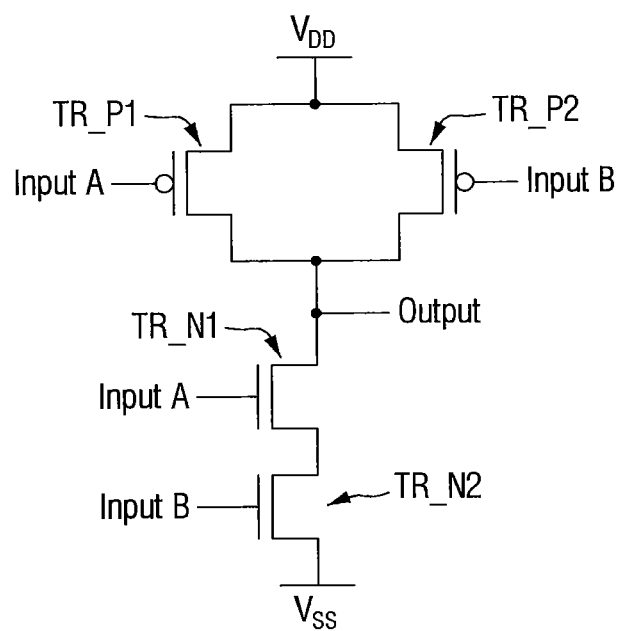
FIG. 10 is a circuit diagram of a 2-input NAND gate according to some embodiments of the present inventive concept.
Figure 11:
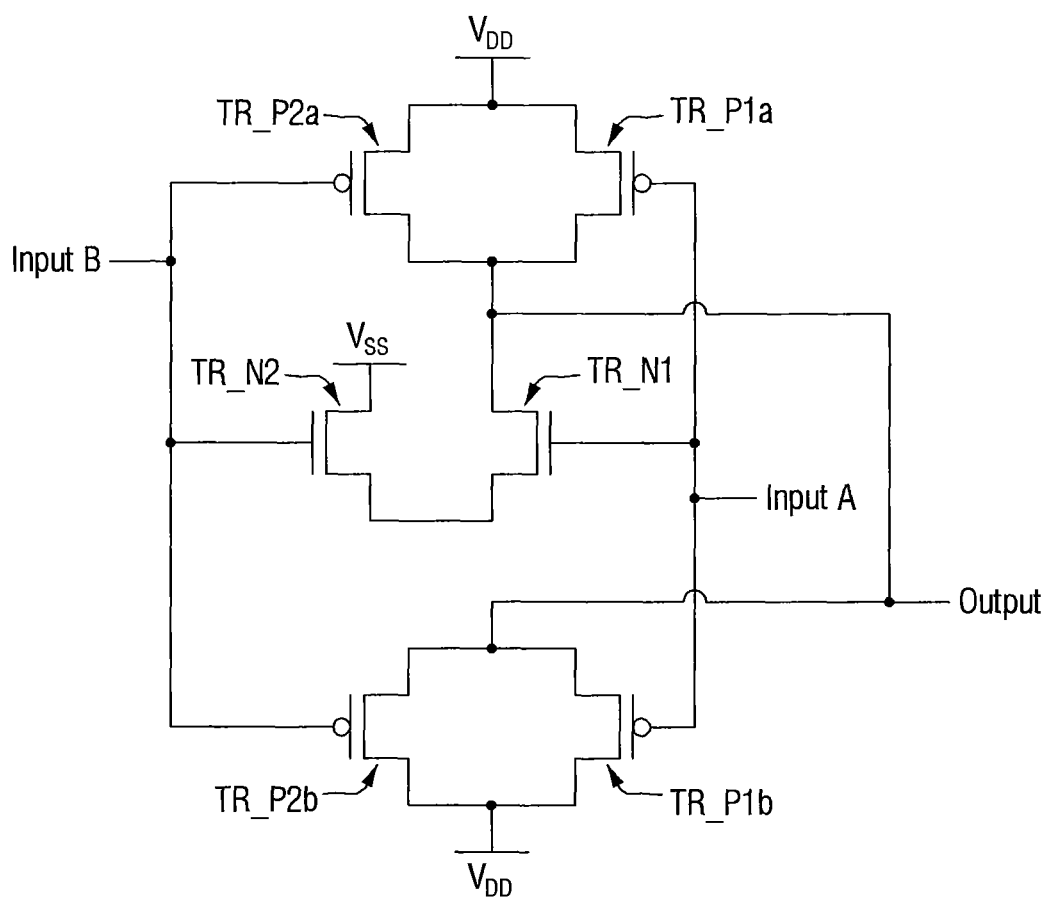
FIG. 11 is a circuit diagram of a 2-input NAND gate according to some embodiments of the present inventive concept.

According to some embodiments of the present inventive concept, the portion of the standard cell shown in FIG. 1 may be a portion of a 2-input NAND gate of FIG. 10 that receive inputs A and B. Referring to FIG. 10, the 2-input NAND gate may include a first P-type VFET TR_P1, a second P-type VFET TR_P2, a first N-type VFET TR_N1, and a second N-type VFET TR_N2. In some embodiments, a 2-input NAND gate may be designed to be a double height cell, and each of the first P-type VFET TR_P1 and the second P-type VFET TR_P2 may include two VFETs to improve drive strength thereof as illustrated in FIG. 11. Referring to FIG. 11, a 2-input NAND gate may include two first P-type VFETs TR_P1a and TR_P1b, and two second P-type VFETs TR_P2a and TR_P2b. In some embodiments, each of the two N-type VFETs may have a size bigger than a size of each of the two first P-type VFETs TR_P1a and TR_P1b and the two second P-type VFETs TR_P2a and TR_P2b. For example, each of the two N-type VFETs TR_N1 and TR_N2 may include a channel region longer than that of each of the two first P-type VFETs TR_P1a and TR_P1b and the two second P-type VFETs TR_P2a and TR_P2b.

Figure 12:
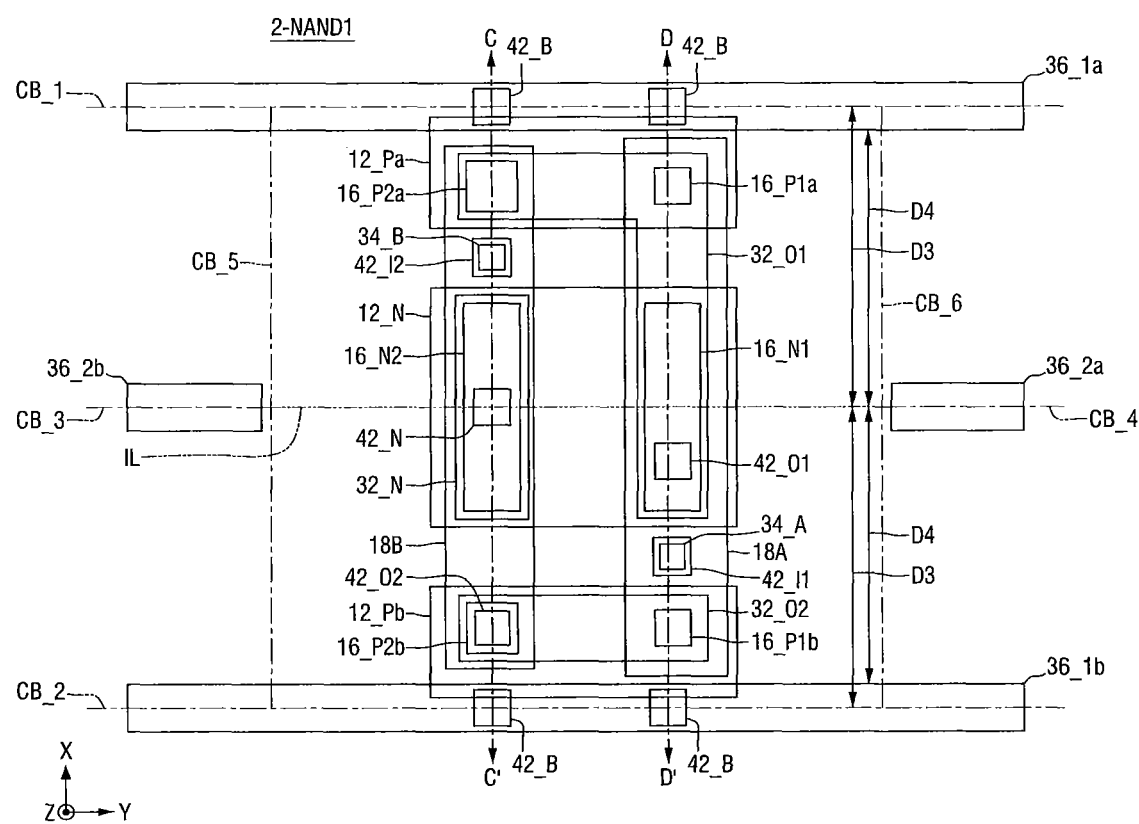
FIG. 12 is a layout of the 2-input NAND gate of FIG. 11 according to some embodiments of the present inventive concept.
Figure 13A:
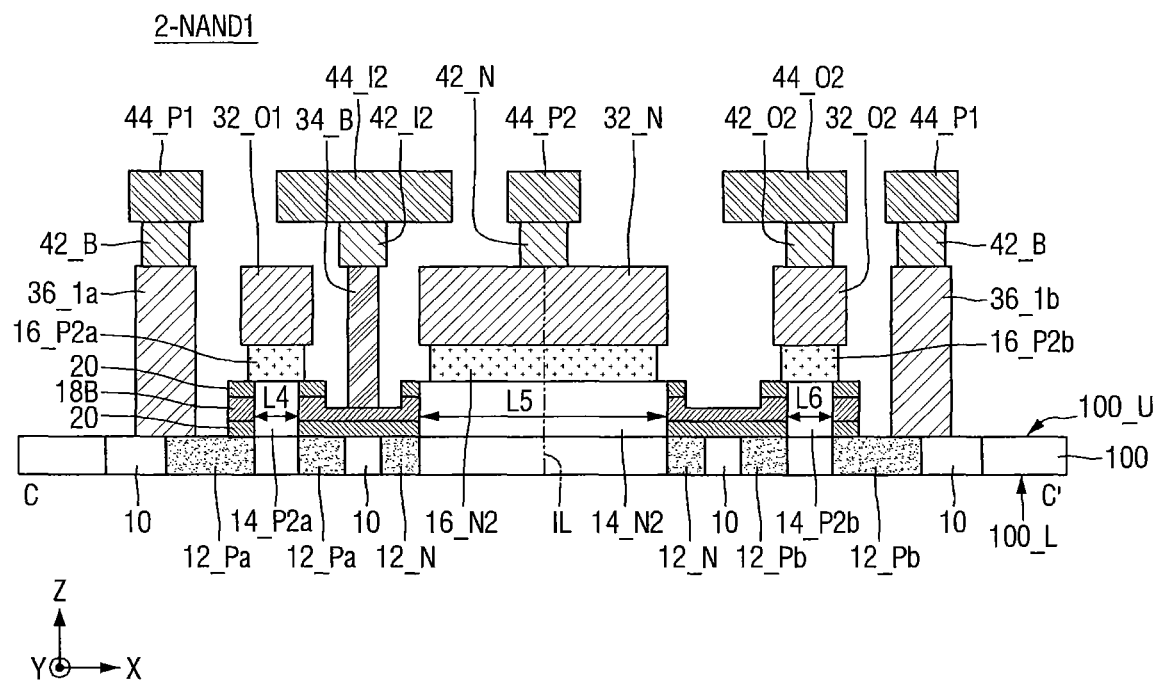
FIGS. 13A and 13B are cross-sectional views taken along the lines C-C' and D-D' of FIG. 12, respectively, according to some embodiments of the present inventive concept.
Figure 13B:
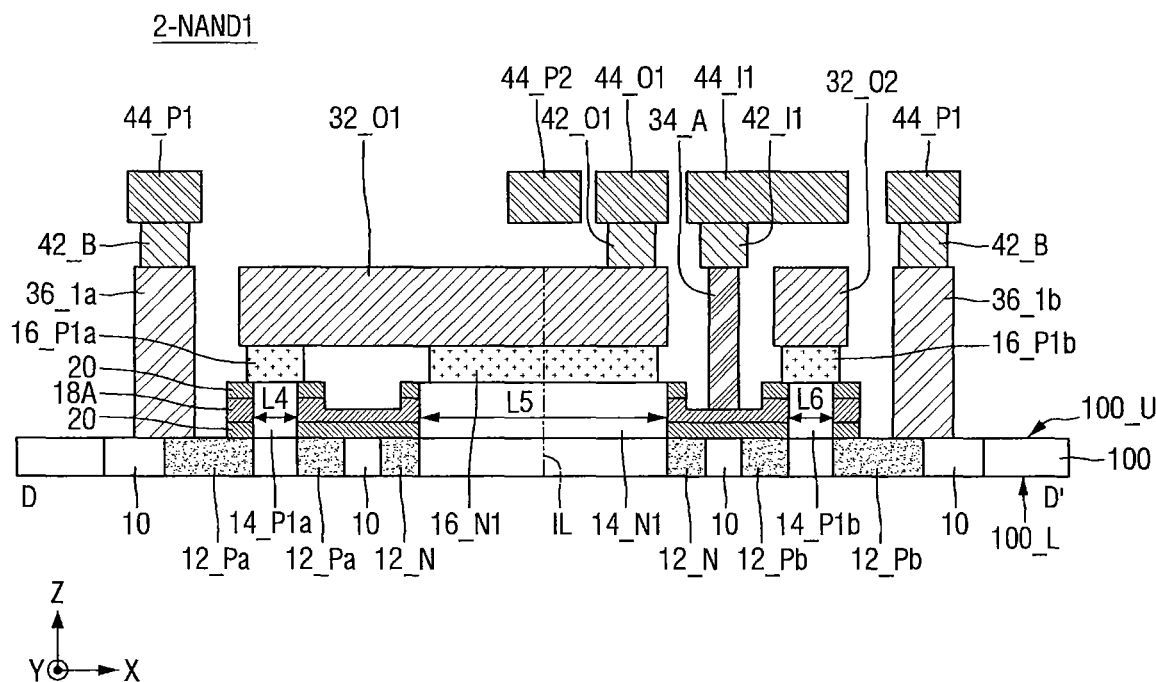

FIG. 12 is a layout of the 2-input NAND of FIG. 11 according to some embodiments of the present inventive concept, and FIGS. 13A and 13B are cross-sectional views taken along the lines C-C' and D-D' of FIG. 12, respectively, according to some embodiments of the present inventive concept.

Referring to FIGS. 12, 13A, and 13B, an 2-input NAND (hereinafter "2-NAND 1") may include two first P-type VFETs TRP1a and TR_P1b shown in FIG. 11, and each of the first P-type VFETs TR_P1a and TR_P1b may include one of first channel regions 14_P1a and 14_P1b and one of first top source/drain regions 16_P1a and 16_P1b. The first N-type VFET TR_N1 may include a second channel region 14_N1 and a second top source/drain region 16_N1. Each of the two second P-type VFETs TR_P2a and TR_P2b may include one of third channel regions 14_P2a and 14_P2b and one of third top source/drain regions 16_P2a and 16_P2b. The second N-type VFET TR_N2 may include a fourth channel region 14_N2 and a fourth top source/drain region 16_N2. Each of the first channel regions 14_P1a and 14_P1b, the second channel region 14_N1, the third channel regions 14_P2a and 14_P2b, and the fourth channel region 14_N2 may protrude from the upper surface 100_U of the substrate 100 in the vertical direction Z.

In some embodiments, the first channel region 14_P1a, the second channel region 14_N1, and the first channel region 14_P1b may be spaced apart from each other in the first horizontal direction X and may be sequentially arranged along the first horizontal direction X, as illustrated in FIG. 13B. In some embodiments, the third channel region 14_P2a, the fourth channel region 14_N2, and the third channel region 14_P2b may be spaced apart from each other in the first horizontal direction X and may be sequentially arranged along the first horizontal direction X, as illustrated in FIG. 13A.

Each of the first channel region 14_P1a and the third channel region 14_P2a may have a fourth length L4 in the first horizontal direction X, each of the second channel region 14_N1 and the fourth channel region 14_N2 may have a fifth length L5 in the first horizontal direction X, and each of the first channel region 14_P1b and the third channel region 14_P2b may have a sixth length L6 in the first horizontal direction X. The fifth length L5 may be longer than the fourth length L4. For example, the fifth length L5 may be greater than 1.5 times the fourth length L4, or the fifth length L5 may be greater than two times the fourth length L4. In some embodiments, the fourth length L4 may be equal to the sixth length L6.

A first bottom source/drain region 12_Pa may include a first portion that is a bottom source/drain region of the first P-type VFET TR_P1a and a second portion that is a bottom source/drain region of the second P-type VFET TR_P2a, and thus the first bottom source/drain region 12_Pa may be shared by the first P-type VFET TR_P1a and the second P-type VFET TR_P2a. A second bottom source/drain region 12_N may include a first portion that is a bottom source/drain region of the first N-type VFET TR_N1 and a second portion that is a bottom source/drain region of the second N-type VFET TR_N2, and thus the second bottom source/drain region 12_N may be shared by the first N-type VFET TR_N1 and the second N-type VFET TR_N2. A third bottom source/drain region 12_Pb may include a first portion that is a bottom source/drain region of the first P-type VFET TR_P1b and a second portion that is a bottom source/drain region of the second P-type VFET TR_P2b, and thus the third bottom source/drain region 12_Pb may be shared by the first P-type VFET TR_P1b and the second P-type VFET TR_P2b.

The 2-NAND 1 may include a first common gate layer 18A and a second common gate layer 18B. A first portion of the first common gate layer 18A may be a first gate electrode of the first P-type VFET TR_P1a, a second portion of the first common gate layer 18A may be a second gate electrode of the first N-type VFET TR_N1, and a third portion of the first common gate layer 18A may be a third gate electrode of the first P-type VFET TR_P1b. As the first common gate layer 18A is shared by the first P-type VFET TR_P1a, the first N-type VFET TR_N1, and the first P-type VFET TR_P1b, an input (e.g., Input A in FIG. 11) of the 2-NAND 1 may be applied through the first common gate layer 18A.

A first portion of the second common gate layer 18B may be a fourth gate electrode of the second P-type VFET TR_P2a, a second portion of the second common gate layer 18B may be a fifth gate electrode of the second N-type VFET TR_N2, and a third portion of the second common gate layer 18B may be a sixth gate electrode of the second P-type VFET TR_P2b. As the second common gate layer 18B is shared by the second P-type VFET TR_P2a, the second N-type VFET TR_N2, and the second P-type VFET TR_P2b, an input (e.g., Input B in FIG. 11) of the 2-NAND 1 may be applied through the second common gate layer 18B.

The 2-NAND 1 may include a first bottom contact 36_1a adjacent the first P-type VFET TR_P1a and a second bottom contact 36_1b adjacent the first P-type VFET TR_P1b. The first bottom contact 36_1a and the second bottom contact 36_1b may be spaced apart from each other in the first horizontal direction X. The first bottom contact 36_1a and the second bottom contact 36_1b may extend on a first cell boundary CB_1 and a second cell boundary CB_2, respectively, which extend in the second horizontal direction Y. Each of the first bottom contact 361a and the second bottom contact 36_1b may extend longitudinally in the second horizontal direction Y.

In some embodiments, as illustrated in FIG. 12, each of the first bottom contact 36_1a and the second bottom contact 36_1b may continuously extend across the 2-NAND 1. Further, each of the first bottom contact 36_1a and the second bottom contact 36_1b may extend into adjacent cells and may be shared with the adjacent cells. The first cell boundary CB_1 may be on a middle of the first bottom contact 36_1a in the first horizontal direction X, and the second cell boundary CB_2 may be on a middle of the second bottom contact 36_1b in the first horizontal direction X.

The first bottom contact 36_1a may be electrically connected to the first bottom source/drain region 12_Pa, and the second bottom contact 36_1b may be electrically connected to the third bottom source/drain region 12_Pb. In some embodiments, both of the first bottom contact 36_1a and the second bottom contact 36_1b may be connected to a first power having a first voltage (e.g., a drain voltage $V_{DD}$), and thus the first power may be applied to the first bottom source/drain region 12_Pa and the third bottom source/drain region 12_Pb. The first bottom contact 36_1a may contact the first bottom source/drain region 12_Pa, and the second bottom contact 36_1b may contact the third bottom source/drain region 12_Pb, as illustrated in FIGS. 13A and 13B.

In some embodiments, as illustrated in FIG. 12, a third bottom contact 36_2a and a fourth bottom contact 36_2b of adjacent cells may not extend into the 2-NAND 1, and thus the 2-NAND 1 may not include the third bottom contact 36_2a and the fourth bottom contact 36_2b. The third bottom contact 36_2a and the fourth bottom contact 36_2b may be connected to a second power having a second voltage (e.g., a source voltage $V_{SS}$) that is different from the first voltage.

Still referring to FIGS. 12, 13A, and 13B, each of the second channel region 14_N1 and the fourth channel region 14_N2 may extend across an imaginary line IL that is equidistant from each of the first and second cell boundaries CB_1 and CB_2 in the first horizontal direction X, and thus each of the second channel region 14_N1 and the fourth channel region 14_N2 may include a portion that is equidistant from each of the first and second cell boundaries CB_1 and CB_2, as illustrated in FIG. 12. The imaginary line IL may be spaced apart from each of the first and second cell boundaries CB_1 and CB_2 by a third distance D3 in the first horizontal direction X. In some embodiments, a middle of each of the second channel region 14_N1 and the fourth channel region 14_N2 in the first horizontal direction X may be on the imaginary line IL. Third and fourth cell boundaries CB_3 and CB_4 of adjacent cells may be aligned with the imaginary line IL along the second horizontal direction Y, as illustrated in FIG. 12. In some embodiments, the imaginary line IL may be spaced apart from each of the first bottom contact 36_1a and the second bottom contact 36_1b by a fourth distance D4 in the first horizontal direction X, as illustrated in FIG. 12.

The 2-NAND 1 may also include first top contacts 32_O1 and 32_O2, a second top contact 32_N, first and second gate contacts 34_A and 34_B, first via contacts 42_I1 and 42_I2, second via contacts 42_O1 and 42_O2, and a third via contact 42_N. First conductive lines 44_I1 and 44_I2, second conductive lines 44_O1 and 44_O2, and third conductive lines 44_P1 and 44_P2 shown in FIGS. 13A and 13B are omitted from view in FIG. 12 for simplicity of illustration.

The first common gate layer 18A may be electrically connected to the first conductive line 44_I1 through the first gate contact 34_A and the first via contact 42_I1. The second common gate layer 18B may be electrically connected to the first conductive line 44_I2 through the second gate contact 34_B and the first via contact 42_I2. In some embodiments, the first and second gate contacts 34_A and 34_B may be on opposite sides of the imaginary line IL, respectively, as illustrated in FIG. 12.

The first top contact 32_O1 may be electrically connected to the first top source/drain region 16_P1a, the second top source/drain region 16_N1, and the third top source/drain region 16_P2a. In some embodiments, the first top contact 32_O1 may contact the first top source/drain region 16_P1a, the second top source/drain region 16_N1, and the third top source/drain region 16_P2a, as illustrated in FIGS. 13A and 13B. The first top source/drain region 16_P1a, the second top source/drain region 16_N1, and the third top source/drain region 16_P2a may be electrically connected to the second conductive line 44_O1 through the first top contact 32_O1 and the second via contact 42_O1.

The first top contact 32_O2 may be electrically connected to the first top source/drain region 16_P1b and the third top source/drain region 16_P2b. In some embodiments, the first top contact 32_O2 may contact the first top source/drain region 16_P1b and the third top source/drain region 16_P2b, as illustrated in FIGS. 13A and 13B. The first top source/drain region 16_P1b and the third top source/drain region 16_P2b may be electrically connected to the second conductive line 44_O2 through the first top contact 32_O2 and the second via contact 42_O2.

The second top contact 32_N may be electrically connected to the fourth top source/drain region 16_N2. In some embodiments, the second top contact 32_N may contact the fourth top source/drain region 16_N2, as illustrated in FIG. 13A. The fourth top source/drain region 16_N2 may be electrically connected to the third conductive line 44_P2 to which a second power having a second voltage (e.g., a source voltage $V_{SS}$) is connected.

The 2-NAND 1 may further include third via contacts 42_B, and each of the third via contacts 42_B may be electrically connected to one of the first bottom contact 36_1a and the second bottom contact 36_1b. In some embodiments, each of the third via contacts 42_B may contact one of the first bottom contact 36_1a and the second bottom contact 36_1b, as illustrated in FIGS. 13A and 13B. The first bottom contact 36_1a and the second bottom contact 36_1b may be connected to the third conductive lines 44_P1, respectively, to which a first power having a first voltage (e.g., a drain voltage $V_{DD}$) is connected.

Each of the first top contacts 32_O1 and 32_O2, the second top contact 32_N, the first and second gate contacts 34_A and 34_B, the first via contacts 42_I1 and 42_I2, the second via contacts 42_O1 and 42_O2, the third via contact 42_N, the first conductive lines 44_I1 and 44_I2, the second conductive lines 44_O1 and 44_O2, and the third conductive lines 44_P1 and 44_P2 may include metal, for example, Co, W, and/or Cu.

Figure 14:
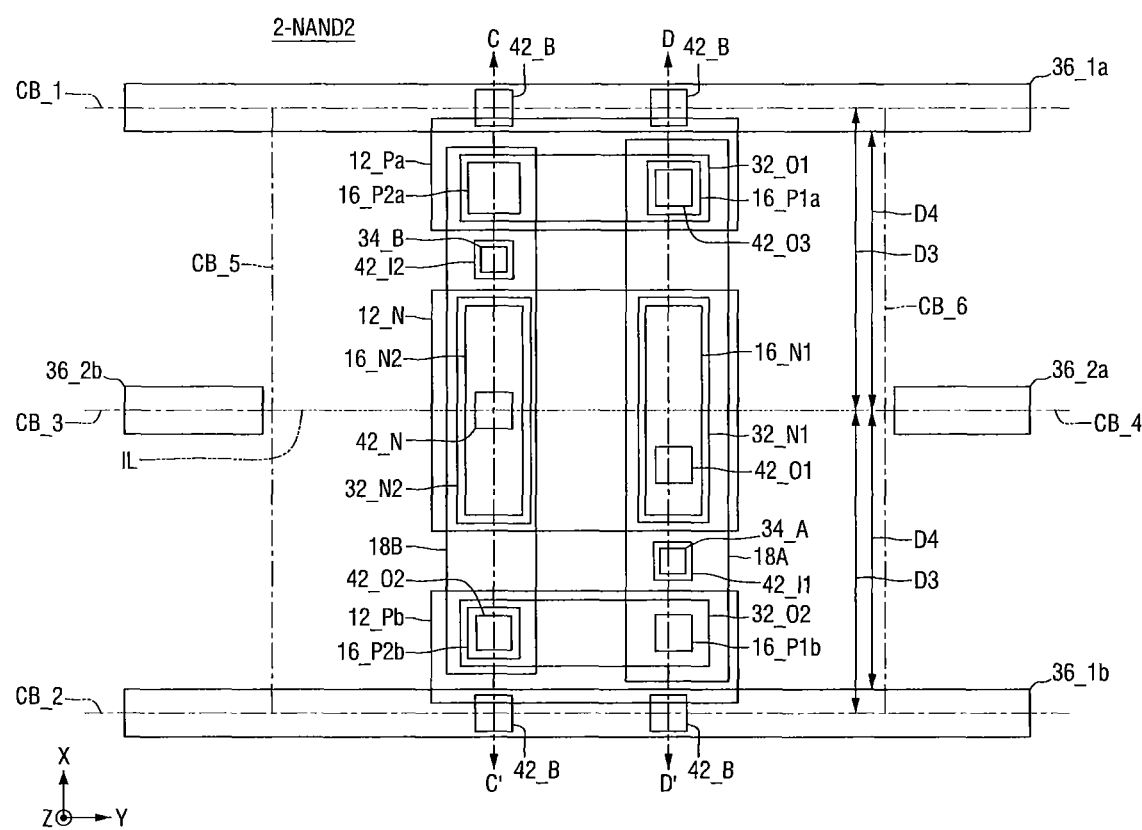
FIG. 14 is a layout of the 2-input NAND gate of FIG. 11 according to some embodiments of the present inventive concept.
Figure 15:
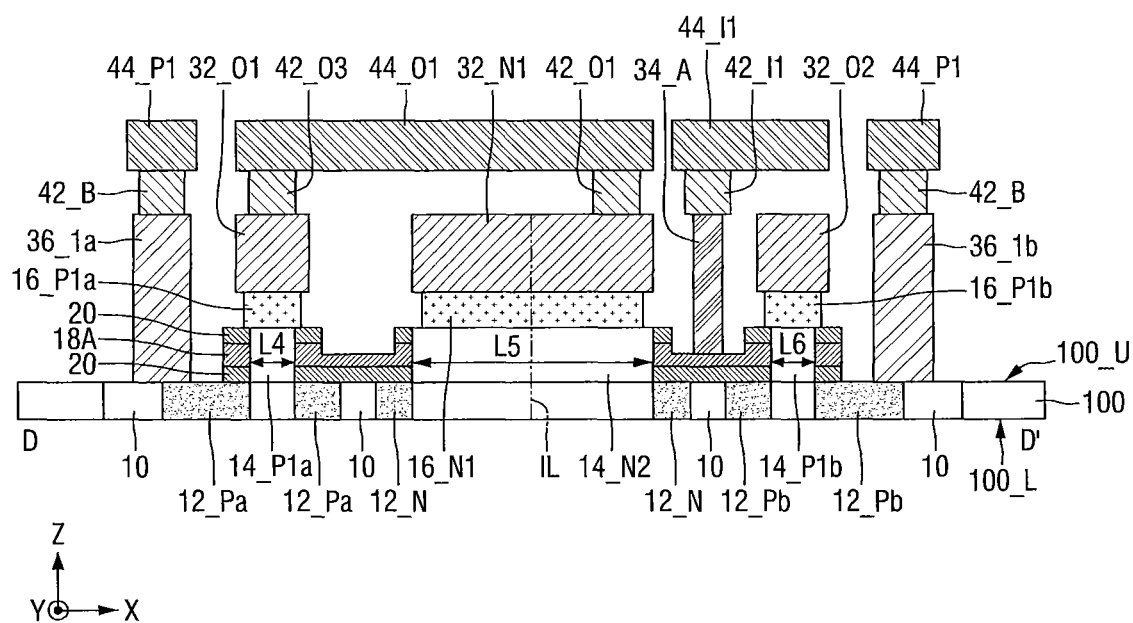
FIG. 15 is a cross-sectional view taken along the D-D' of FIG. 14 according to some embodiments of the present inventive concept.

FIG. 14 is a layout of the 2-input NAND gate of FIG. 11 according to some embodiments of the present inventive concept, and FIG. 15 is a cross-sectional view taken along the D-D' of FIG. 14, respectively, according to some embodiments of the present inventive concept.

Referring to FIGS. 14 and 15, a 2-input NAND gate (hereinafter "2-NAND 2") may be the same as or similar to the 2-NAND 1 discussed with reference to FIGS. 12, 13A, and 13B except several elements discussed herein. A cross-sectional view taken along the line C-C' of FIG. 14 may be the same as or similar to the cross-sectional view shown in FIG. 13A.

The first top contact 32_O1 may have a straight line shape and may be electrically connected to the first top source/drain region 16_P1a and the third top source/drain region 16_P2a. In some embodiments, the first top contact 32_O1 may contact the first top source/drain region 16_P1a and the third top source/drain region 16_P2a. The first top source/drain region 16_P1a may be electrically connected to the second conductive line 44_O1 through the first top contact 32_O1 and a second via contact 42_O3.

A second top contact 32_N1 may contact and may be electrically connected to the second top source/drain region 16_N1. The second top source/drain region 16_N1 may be electrically connected to second conductive line 44_O1 through the second top contact 32_N1 and the second via contact 42_O1.

Figure 16:
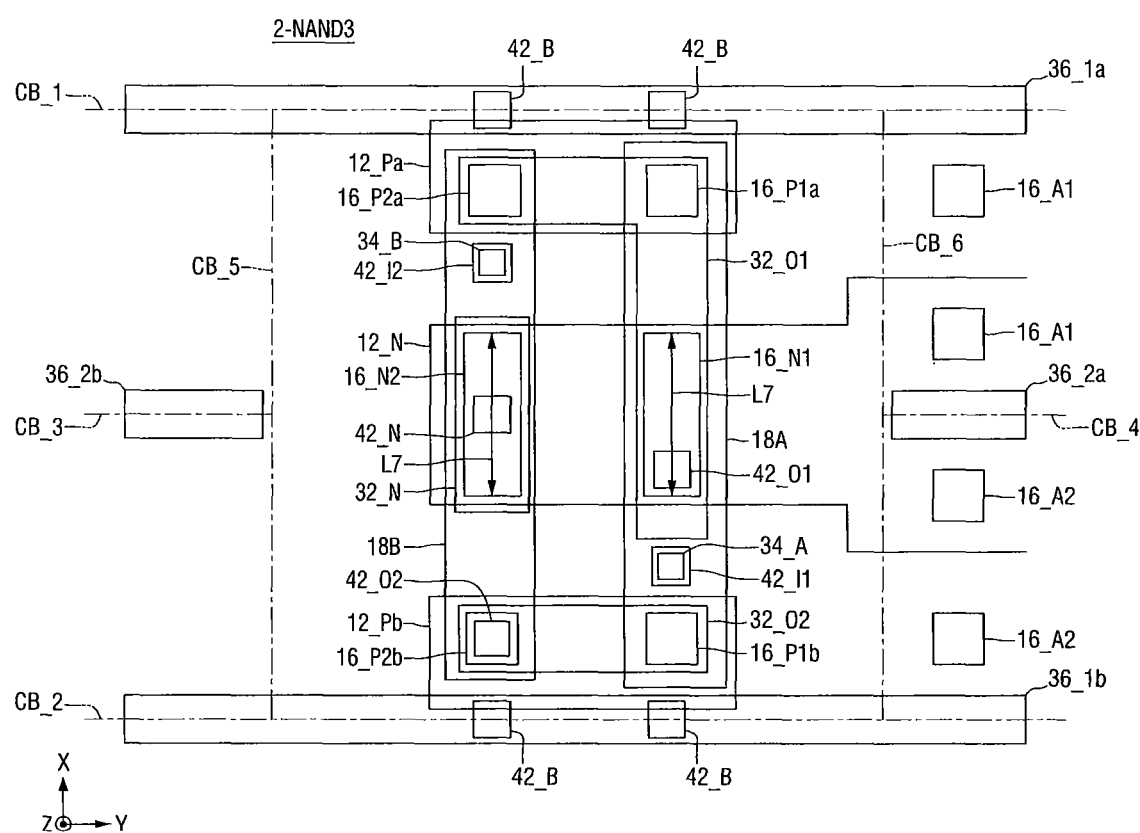
FIG. 16 is a layout of the 2-input NAND gate of FIG. 11 according to some embodiments of the present inventive concept.

FIG. 16 is a layout of the 2-input NAND gate of FIG. 11 according to some embodiments of the present inventive concept. A 2-input NAND gate (hereinafter "2-NAND 3") shown in FIG. 16 may be the same as or similar to the 2-NAND 1 discussed with reference to FIGS. 12, 13A, and 13B except several elements discussed herein.

Referring to FIG. 16, each of the second top source/drain region 16_N1 and the fourth top source/drain region 16_N2 may have a seventh length L7 that is shorter than the fifth length L5 shown in FIGS. 13A and 13B. It will be understood that each of the second channel region 14_N1 and the fourth channel region 14_N2 may have a length similar to the seventh length L7. The seventh length L7 may be determined to balance drive strengths of P-type transistors and N-type transistors. In some embodiments, a length of the second bottom source/drain region 12_N in the first horizontal direction may be reduced, and the second bottom source/drain region 12_N may have a stepped profile adjacent the sixth cell boundary CB_6 as illustrated in FIG. 16 when adjacent standard cells are single height cells including top source/drain regions 16_A1 and 16_A2.

Figure 17:
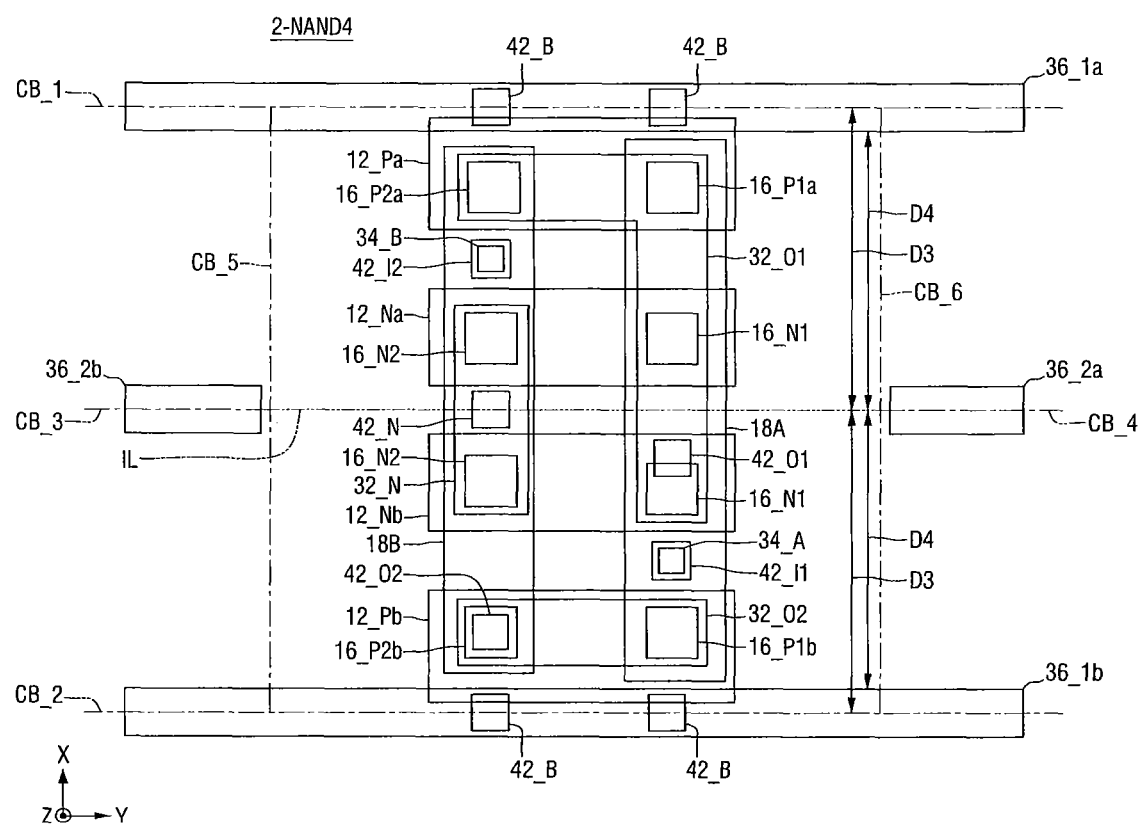
FIG. 17 is a layout of the 2-input NAND gate of FIG. 11 according to some embodiments of the present inventive concept.

FIG. 17 is a layout of the 2-input NAND of FIG. 11 according to some embodiments of the present inventive concept. A 2-input NAND gate (hereinafter "2-NAND 4") shown in FIG. 17 may be the same as or similar to the 2-NAND 1 discussed with reference to FIGS. 12, 13A, and 13B except several elements discussed herein.

Referring to FIG. 17, each of the first N-type VFET TR_N1 and the second N-type VFET TR_N2 may include two VFETs. Accordingly, the 2-NAND 4 may include a pair of second top source/drain regions 16_N1 that are spaced apart from each other in the first horizontal direction X and a pair of fourth top source/drain region 16_N2 that are spaced apart from each other in the first horizontal direction X. The 2-NAND 4 may also include a pair of second channel region 14_N1 (not shown in FIG. 17) under the pair of second top source/drain regions 16_N1, respectively, and a pair of fourth channel region 14_N2 (not shown in FIG. 17) under the pair of fourth top source/drain region 16_N2, respectively. Further, the 2-NAND 4 may include a pair of second bottom source/drain regions 12_Na and 12_Nb that are spaced apart from each other in the first horizontal direction X.

Figure 18:
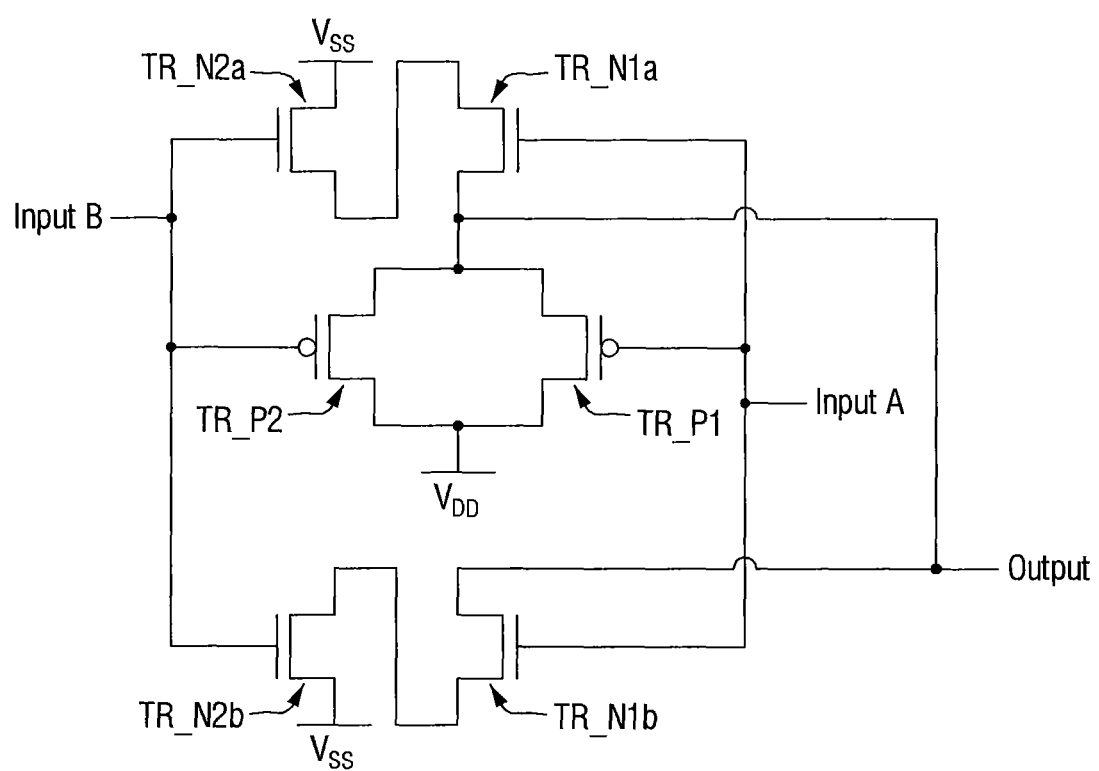
FIG. 18 is a circuit diagram of the 2-input NAND gate as shown in FIG. 10 according to some embodiments of the present inventive concept.
Figure 19:
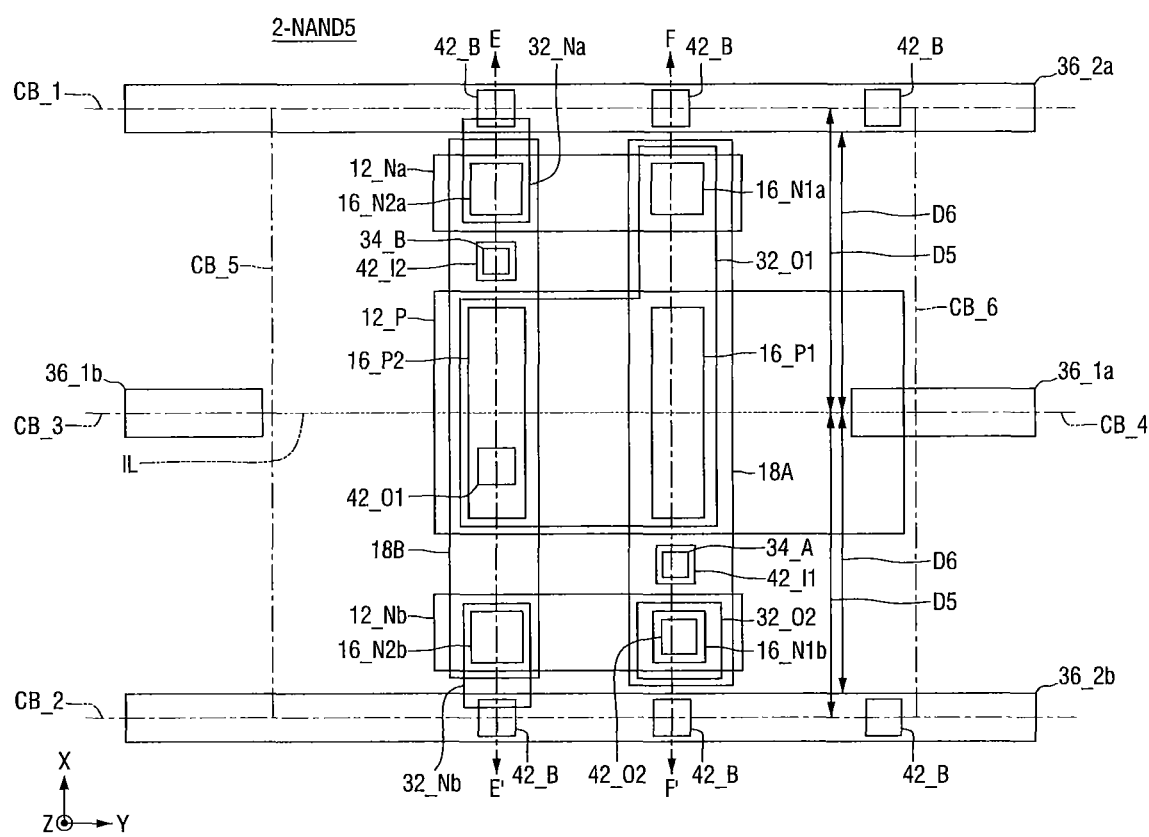
FIG. 19 is a layout of the 2-input NAND gate of FIG. 18 according to some embodiments of the present inventive concept.

FIG. 18 is a circuit diagram of the 2-input NAND gate as shown in FIG. 10 according to some embodiments of the present inventive concept. A 2-input NAND gate (hereinafter "2-NAND 5") of FIG. 18 may include two first N-type VFETs TR_N1a and TR_N1b, two second N-type VFETs TR_N2a and TR_N2b, a single first P-type VFET TR_P1, and a single second P-type VFET TR_P2. FIG. 19 is a layout of the 2-NAND 5 of FIG. 18 according to some embodiments of the present inventive concept, and FIGS. 20A and 20B are cross-sectional views taken along the lines E-E' and F-F' of FIG. 19, respectively, according to some embodiments of the present inventive concept.

Figure 20A:
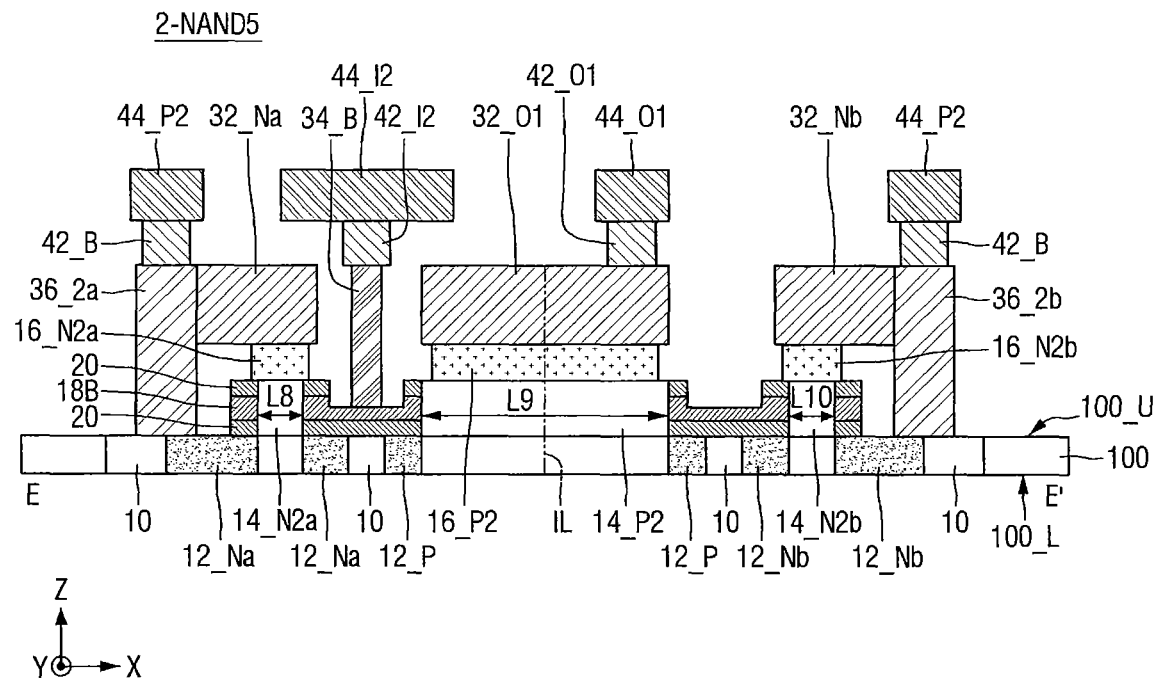
FIGS. 20A and 20B are cross-sectional views taken along the lines E-E' and F-F of FIG. 19, respectively, according to some embodiments of the present inventive concept.
Figure 20B:
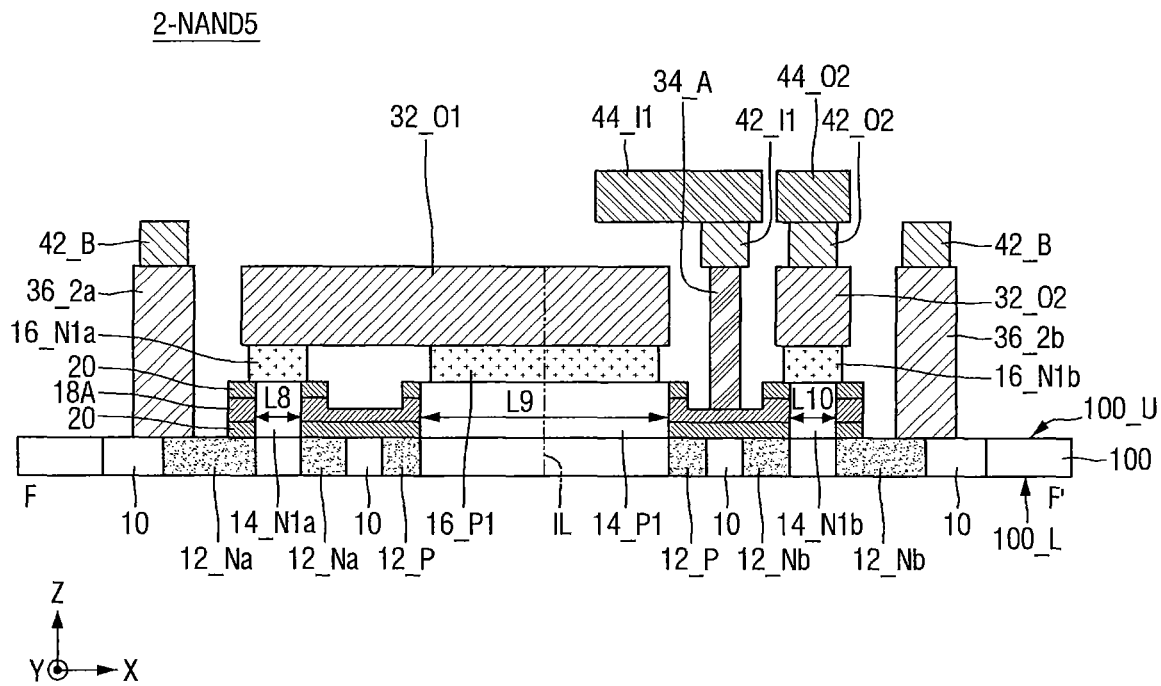

Referring to FIGS. 19, 20A, and 20B, each of the two first N-type VFETs TR_N1a and TR_N1b may include one of first channel regions 14_N1a and 14_N1b and one of first top source/drain regions 16_N1a and 16_N1b. The first P-type VFET TR_P1 may include a second channel region 14_P1 and a second top source/drain region 16_P1. Each of the two second N-type VFETs TR_N2a and TR_N2b may include one of third channel regions 14_N2a and 14_N2b and one of third top source/drain regions 16_N2a and 16_N2b. The second P-type VFET TR_P2 may include a fourth channel region 14_P2 and a fourth top source/drain region 16_P2. Each of the first channel regions 14_N1a and 14_N1b, the second channel region 14_P1, the third channel regions 14_N2a and 14N2b, and the fourth channel region 14_P2 may protrude from the upper surface 100_U of the substrate 100 in the vertical direction Z.

In some embodiments, the first channel region 14_N1a, the second channel region 14_P1, and the first channel region 14_N1b may be spaced apart from each other in the first horizontal direction X and may be sequentially arranged along the first horizontal direction X, as illustrated in FIG. 20B. In some embodiments, the third channel region 14_N2a, the fourth channel region 14_P2, and the third channel region 14_N2b may be spaced apart from each other in the first horizontal direction X and may be sequentially arranged along the first horizontal direction X, as illustrated in FIG. 20A.

Each of the first channel region 14_N1a and the third channel region 14_N2a may have an eighth length L8 in the first horizontal direction X, each of the second channel region 14_P1 and the fourth channel region 14_P2 may have an ninth length L9 in the first horizontal direction X, and each of the first channel region 14_N1b and the third channel region 14_N2b may have a tenth length L10 in the first horizontal direction X. The ninth length L9 may be longer than the eighth length L8. For example, the ninth length L9 may be greater than 1.5 times the eighth length L8, or the ninth length L9 may be greater than two times the eighth length L8. In some embodiments, the eighth length L8 may be equal to the tenth length L10.

A first bottom source/drain region 12_Na may include a first portion that is a bottom source/drain region of the first N-type VFET TR_N1a and a second portion that is a bottom source/drain region of the second N-type VFET TR_N2a, and thus the first bottom source/drain region 12_Na may be shared by the first N-type VFET TR_N1a and the second N-type VFET TR_N2a. A second bottom source/drain region 12_P may include a first portion that is a bottom source/drain region of the first P-type VFET TR_P1 and a second portion that is a bottom source/drain region of the second P-type VFET TR_P2, and thus the second bottom source/drain region 12_P may be shared by the first P-type VFET TR_P1 and the second P-type VFET TR_P2. A third bottom source/drain region 12_Nb may include a first portion that is a bottom source/drain region of the first N-type VFET TR_N1b and a second portion that is a bottom source/drain region of the second N-type VFET TR_N2b, and thus the third bottom source/drain region 12_Nb may be shared by the first N-type VFET TR_N1b and the second N-type VFET TR_N2b.

The 2-NAND 5 may include a first common gate layer 18A and a second common gate layer 18B. A first portion of the first common gate layer 18A may be a first gate electrode of the first N-type VFET TR_N1a, a second portion of the first common gate layer 18A may be a second gate electrode of the first P-type VFET TR_P1, and a third portion of the first common gate layer 18A may be a third gate electrode of the first N-type VFET TR_N1b. As the first common gate layer 18A is shared by the first N-type VFET TR_N1a, the first P-type VFET TR_P1, and the first N-type VFET TR_N1b, an input (e.g., Input A in FIG. 18) of the 2-NAND 5 may be applied through the first common gate layer 18A.

A first portion of the second common gate layer 18B may be a fourth gate electrode of the second N-type VFET TR_N2a, a second portion of the second common gate layer 18B may be a fifth gate electrode of the second P-type VFET TR_P2, and a third portion of the second common gate layer 18B may be a sixth gate electrode of the second N-type VFET TR_N2b. As the second common gate layer 18B is shared by the second N-type VFET TR_N2a, the second P-type VFET TR_P2, and the second N-type VFET TR_N2b, an input (e.g., Input B in FIG. 18) of the 2-NAND 5 may be applied through the second common gate layer 18B.

The 2-NAND 5 may include a first bottom contact 36_2a adjacent the first N-type VFET TR_N1a and a second bottom contact 36_2b adjacent the first N-type VFET TR_N1b. The first bottom contact 36_2a and the second bottom contact 36_2b may be spaced apart from each other in the first horizontal direction X. The first bottom contact 36_2a and the second bottom contact 36_2b may extend along a first cell boundary CB_1 and a second cell boundary CB_2, respectively, which extend in the second horizontal direction Y. Each of the first bottom contact 36_2a and the second bottom contact 36_2b may extend longitudinally in the second horizontal direction Y.

In some embodiments, as illustrated in FIG. 19, each of the first bottom contact 36_2a and the second bottom contact 36_2b may continuously extend across the 2-NAND 5. Further, each of the first bottom contact 36_2a and the second bottom contact 36_2b may extend into adjacent cells and may be shared with the adjacent cells. The first cell boundary CB_1 may be on a middle of the first bottom contact 36_2a in the first horizontal direction X, and the second cell boundary CB_2 may be on a middle of the second bottom contact 36_2b in the first horizontal direction X.

The 2-NAND 5 may also include first top contacts 32_O1 and 32_O2, second top contacts 32_Na and 32_Nb, first and second gate contacts 34_A and 34_B, first via contacts 42_I1 and _I2, and second via contacts 42_O1 and 42_O2. First conductive lines 44_I1 and 44_I2, second conductive lines 44_O1 and 44_O2, and third conductive lines 44_P1 and 44_P2 shown in FIGS. 20A and 20B are omitted from view in FIG. 19 for simplicity of illustration.

The first bottom contact 36_2a may be electrically connected to the third top source/drain region 16_N2a through the second top contact 32_Na, and the second bottom contact 36_2b may be electrically connected to the third top source/drain region 16_N2b through the second top contact 32_Nb. In some embodiments, both of the first bottom contact 36_2a and the second bottom contact 36_2b may be connected to a second power having a second voltage (e.g., a source voltage $V_{SS}$), and thus the second power may be applied to the third top source/drain regions 16_N2a and 16_N2b. The first bottom contact 36_2a may contact the second top contact 32_Na, and the second bottom contact 36_2b may contact the second top contact 32_Nb, as illustrated in FIG. 20A.

In some embodiments, as illustrated in FIG. 19, the integrated circuit device may include a third bottom contact 36_1a and a fourth bottom contact 36_1b of adjacent cells, and the third bottom contact 36_1a may extend into the 2-NAND 5 to be electrically connected to the second bottom source/drain region 12_P. The third bottom contact 36_1a and the fourth bottom contact 36_1b may be connected to a first power having a first voltage (e.g., a drain voltage $V_{DD}$) that is different from the second voltage. In some embodiments, the second bottom source/drain region 12_P may protrude in the second horizontal direction Y to provide a portion contacted by the third bottom contact 36_1a, as illustrated in FIG. 19.

Still referring to FIGS. 19, 20A, and 20B, each of the second channel region 14_P1 and the fourth channel region 14_P2 may extend across an imaginary line IL that is equidistant from each of the first and second cell boundaries CB_1 and CB_2 in the first horizontal direction X, and thus each of the second channel region 14_P1 and the fourth channel region 14_P2 may include a portion that is equidistant from each of the first and second cell boundaries CB_1 and CB_2, as illustrated in FIG. 19. The imaginary line IL may be spaced apart from each of the first and second cell boundaries CB_1 and CB_2 by a fifth distance D5 in the first horizontal direction X. In some embodiments, a middle of each of the second channel region 14_P1 and the fourth channel region 14_P2 in the first horizontal direction X may be on the imaginary line IL. Third and fourth cell boundaries CB_3 and CB_4 of adjacent cells may be aligned with the imaginary line IL along the second horizontal direction Y, as illustrated in FIG. 19. In some embodiments, the imaginary line IL may be spaced apart from each of the first bottom contact 36_2a and the second bottom contact 36_2b by a sixth distance D6 in the first horizontal direction X, as illustrated in FIG. 19.

The first common gate layer 18A may be electrically connected to the first conductive line 44_I1 through the first gate contact 34_A and the first via contact 42_I1. The second common gate layer 18B may be electrically connected to the first conductive line 44_I2 through the second gate contact 34_B and the first via contact 42_I2. In some embodiments, the first and second gate contacts 34_A and 34_B may be on opposite sides of the imaginary line IL, as illustrated in FIG. 19.

The first top contact 32_O1 may be electrically connected to the first top source/drain region 16_N1a, the second top source/drain region 16_P1, and the fourth top source/drain region 16_P2. In some embodiments, the first top contact 32_O1 may contact the first top source/drain region 16_N1a, the second top source/drain region 16_P1, and the fourth top source/drain region 16_P2, as illustrated in FIGS. 20A and 20B. The first top source/drain region 16_N1a, the second top source/drain region 16_P1, and the fourth top source/drain region 16_P2 may be electrically connected to the second conductive line 44_O1 through the first top contact 32_O1 and the second via contact 42_O1.

The first top contact 32_O2 may be electrically connected to the first top source/drain region 16_N1b. In some embodiments, the first top contact 32_O2 may contact the first top source/drain region 16_N1b, as illustrated in FIG. 20B. The first top source/drain region 16_N1b may be electrically connected to the second conductive lines 44_O2 through the first top contact 32_O2 and the second via contact 42_O2.

The 2-NAND 5 may further include third via contacts 42_B, and each of the third via contacts 42_B may be electrically connected to one of the first bottom contact 36_2a and the second bottom contact 36_2b. In some embodiments, each of the third via contacts 42_B may contact one of the first bottom contact 36_2a and the second bottom contact 36_2b, as illustrated in FIG. 20A. In some embodiments, each of the third via contacts 42_B may be electrically connected to third conductive lines 44_P2 to which a second power having a second voltage (e.g., a source voltage $V_{SS}$) is connected.

Each of the first top contacts 32_O1 and 32_O2, the second top contacts 32_Na and 32_Nb, the first and second gate contacts 34_A and 34_B, the first via contacts 42_I1 and 42_I2, and the second via contacts 42_O1 and 42_O2, the first conductive lines 44_I1 and 44_I2, the second conductive lines 44_O1 and 44_O2, and the third conductive lines 44_P1 and 44_P2 may include metal, for example, Co, W, and/or Cu.

Figure 21:
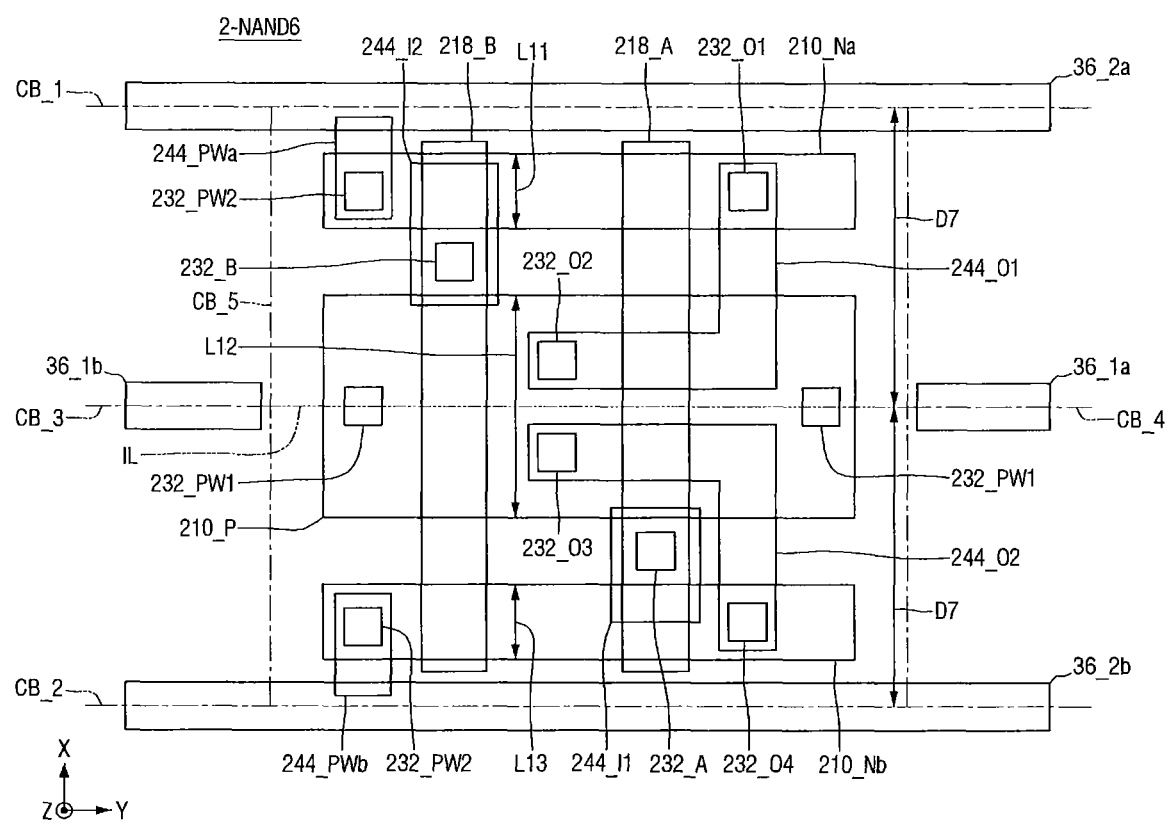
FIG. 21 is a layout of the 2-input NAND gate of FIG. 18 according to some embodiments of the present inventive concept.

FIG. 21 is a layout of the 2-input NAND gate (hereinafter "2-NAND 6") of FIG. 18 according to some embodiments of the present inventive concept. Referring to FIG. 21, a 2-input NAND gate (hereinafter "2-NAND 6") may include fin Field-effect transistor (FinFET) transistors, and each of the first N-type transistors TR_N1a and TR_N1b, the second N-type transistors TR_N2a and TR_N2b, the first P-type transistor TR_P1, and the second P-type transistor TR_P2 may be a fin Field-effect transistor (FinFET) transistor.

The 2-NAND 6 may include a first active region 210_Na, a second active region 210_P, and a third active region 210_Nb. Each of the first active region 210_Na, the second active region 210_P, and the third active region 210_Nb may protrude from the upper surface 100_U of the substrate 100 in the vertical direction Z. The first active region 210_Na, the second active region 210_P, and the third active region 210_Nb may be spaced apart from each other in the first horizontal direction X and may be sequentially arranged along the first horizontal direction X, as illustrated in FIG. 21.

The first active region 210_Na may have an eleventh length L11 in the first horizontal direction X, the second active region 210_P may have a twelfth length L12 in the first horizontal direction X, and the third active region 210_Nb may have a thirteenth length L13 in the first horizontal direction X. The twelfth length L12 may be longer than the eleventh length L11. For example, the twelfth length L12 may be greater than 1.5 times the eleventh length L11, or the twelfth length L12 may be greater than two times the eleventh length L11. In some embodiments, the eleventh length L11 may be equal to the thirteenth length L13.

The second active region 210_P may extend across an imaginary line IL that is equidistant from each of the first and second cell boundaries CB_1 and CB_2 in the first horizontal direction X, and thus the second active region 210_P may include a portion that is equidistant from each of the first and second cell boundaries CB_1 and CB_2, as illustrated in FIG. 21. The imaginary line IL may be spaced apart from each of the first and second cell boundaries CB_1 and CB_2 by a seventh distance D7 in the first horizontal direction X. In some embodiments, a middle of the second active region 210_P in the first horizontal direction X may be on the imaginary line IL.

A first common gate layer 218_A and a second common gate layer 218_B may extend on the first active region 210_Na, the second active region 210_P, and the third active region 210_Nb. The first common gate layer 218_A may be shared by the first N-type transistor TR_N1a, the first P-type transistor TR_P1, and the first N-type transistor TR_N1b, and thus an input (e.g., Input A in FIG. 18) of the 2-NAND 6 may be applied through the first common gate layer 218_A. The second common gate layer 218_B may be shared by the second N-type transistor TR_N2a, the second P-type transistor TR_P2, and the second N-type transistor TR_N2b, and thus an input (e.g., Input B in FIG. 18) of the 2-NAND 6 may be applied through the second common gate layer 218_B.

The 2-NAND 6 may include first and second gate contacts 232_A and 232_B and input conductive lines 244_I1 and 244_I2. The first gate contact 232_A and the input conductive line 244_I1 may be sequentially stacked on the first common gate layer 218_A. The first common gate layer 218_A may be electrically connected to the input conductive line 244_I1 through the first gate contact 232_A, and an input (e.g., Input A in FIG. 18) of the 2-NAND 6 may be applied to the input conductive line 244_I1. The second gate contact 232_B and the input conductive line 244_I2 may be sequentially stacked on the second common gate layer 218_B. The second common gate layer 218_B may be electrically connected to the input conductive line 244_I2 through the second gate contact 232_B, and an input (e.g., Input B in FIG. 18) of the 2-NAND 6 may be applied to the input conductive line 244_I2.

The 2-NAND 6 may also include first power contacts 232_PW1, second power contacts 232_PW2, and power conductive lines 244_PWa and 244_PWb. The first power contacts 232_PW1 may contact source/drain regions of the second active region 210_P, respectively. The first power contacts 232_PW1 may be connected to a first power having a first voltage (e.g., a drain voltage $V_{DD}$), and thus the first power may be applied to the source/drain regions of the second active region 210_P. The first power contacts 232_PW1 may be electrically connected to conductive lines (not shown) provided on the first power contacts 232_PW1, respectively.

The second power contacts 232_PW2 may contact a source/drain region of the first active region 210_Na and a source/drain region of the third active region 210_Nb, respectively. The second power contacts 232_PW2 may be electrically connected the power conductive lines 244_PWa 244_PWb, respectively, and the power conductive lines 244_PWa and 244_PWb may be electrically connected to the first bottom contact 36_2a and the second bottom contact 36_2b, respectively. The first bottom contact 36_2a and the second bottom contact 36_2b may be connected to a second power having a second voltage (e.g., a source voltage $V_{SS}$).

The 2-NAND 6 may include first, second, third and fourth output contacts 232_O1, 232_O2, 232_O3, and 232_O4 contacting source/drain regions of the first active region 210_Na, the second active region 210_P, and the third active region 210_Nb. A first output conductive line 244_O1 may be provided on the first and second output contacts 232_O1 and 232_O2 and may be electrically connected to the first and second output contacts 232_O1 and 232_O2. A second output conductive line 244_O2 may be provided on the third and fourth output contacts 232_O3 and 232_O4 and may be electrically connected to the third and fourth output contacts 232_O3 and 232_O4.

Figure 22:
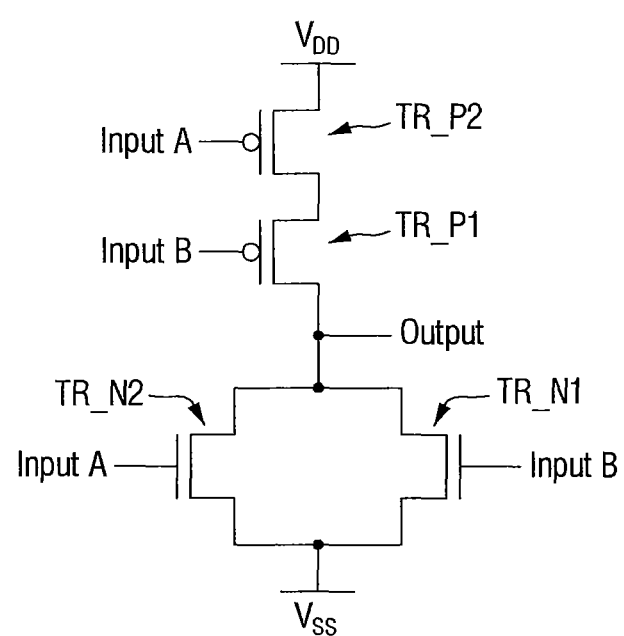
FIG. 22 is a circuit diagram of a 2-input NOR gate according to some embodiments of the present inventive concept.

According to some embodiments of inventive concept, a standard cell may be a 2-input NOR gate as shown in FIG. 22. Differences between the 2-input NOR gate of FIG. 22 and the 2-input NAND gate of FIG. 10 are only conductivity types of transistors and voltages of power connected to transistors connected in parallel and transistors connected in series. Accordingly, it will be understand that a 2-input NOR gate can be designed to have layouts and cross-sections the same as or similar to those discussed with reference to FIGS. 12-17 and 19-21.

Figure 23:
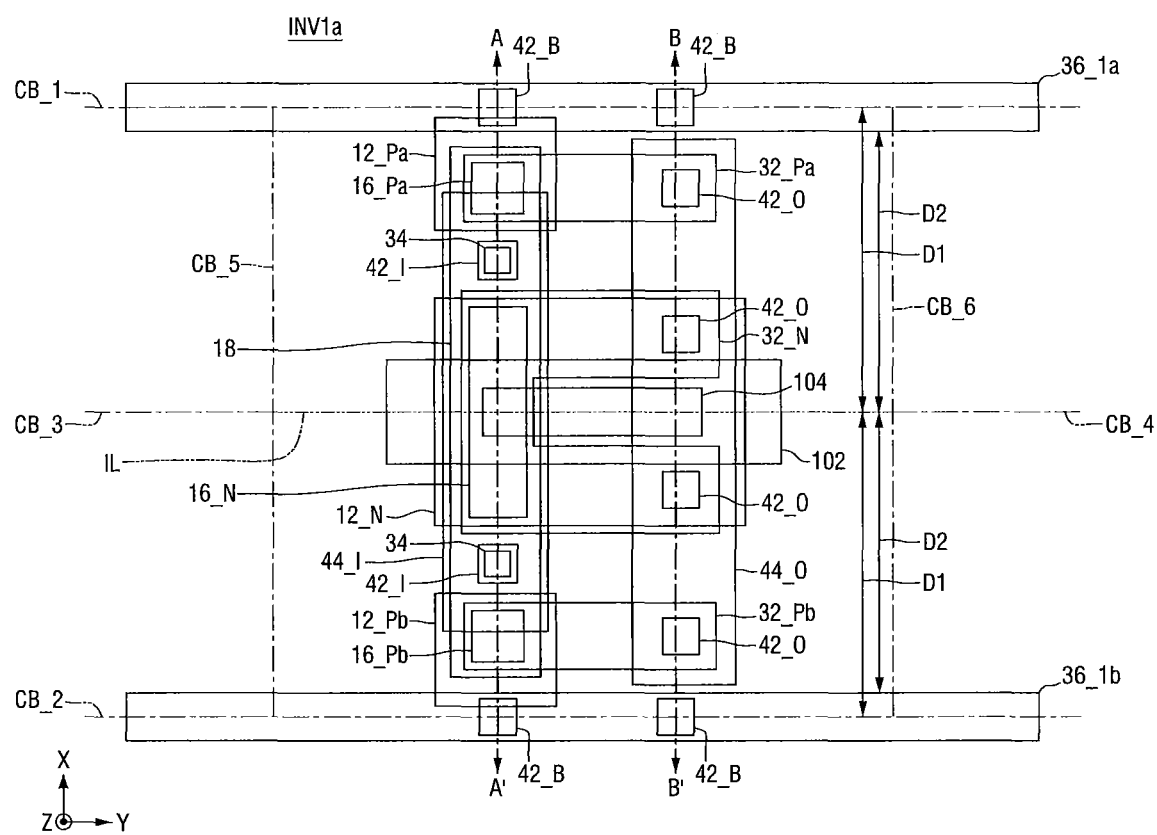
FIG. 23 is a layout of the inverter of FIG. 3 according to some embodiments of the present inventive concept.
Figure 24A:
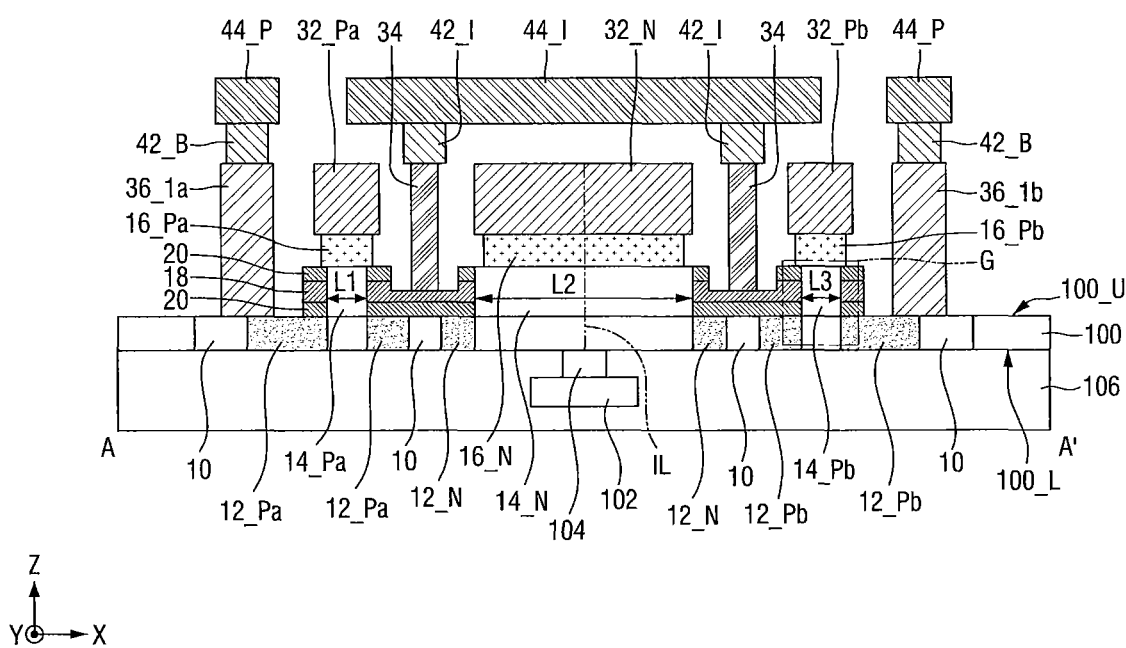
FIGS. 24A and 24B are cross-sectional views taken along the lines A-A' and B-B' of FIG. 23, respectively, according to some embodiments of the present inventive concept.
Figure 24B:
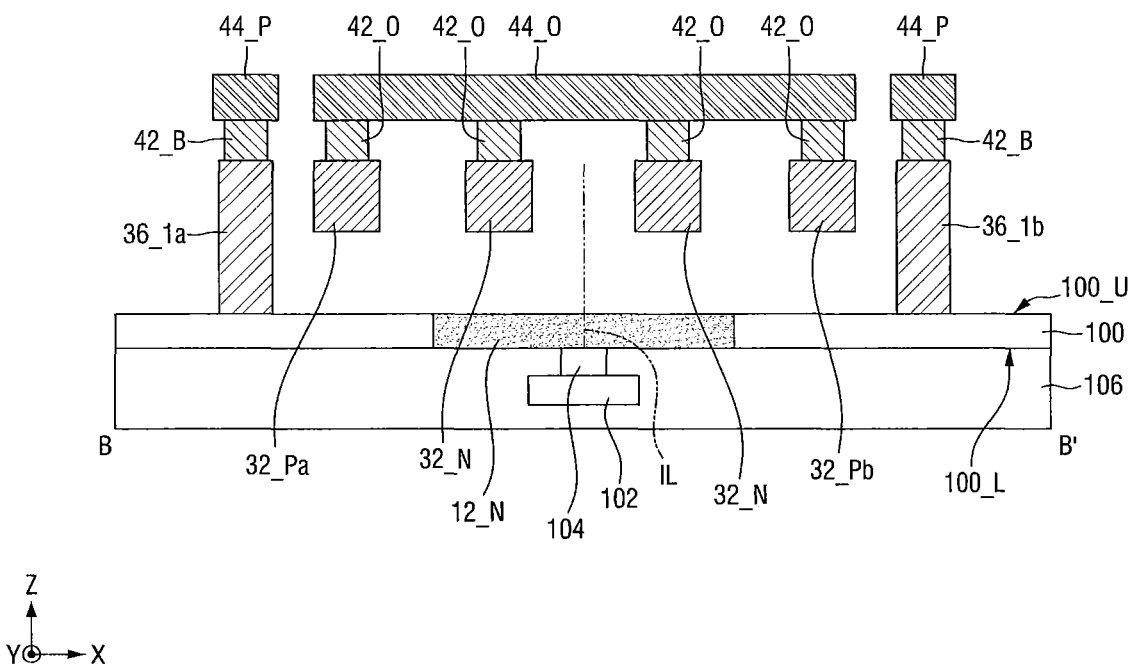

FIG. 23 is a layout of the inverter of FIG. 3 according to some embodiments of the present inventive concept. FIGS. 24A and 24B are cross-sectional views taken along the lines A-A' and B-B' of FIG. 23, respectively, according to some embodiments of the present inventive concept.

Referring to FIGS. 23, 24A, and 24B, an inverter (hereinafter "INV1a") may be substantially the same as the INV1 shown in FIGS. 4, 5A, and 5B except several elements discussed hereinafter. The INV1a may include a buried power line 102 and a buried power via 104, which are electrically connected to the second bottom source/drain region 12_N. In some embodiments, the INV1a may also include a buried insulating layer 106 in which the buried power line 102 and the buried power via 104 are disposed.

In some embodiments, the buried power via 104 may directly contact the second bottom source/drain region 12_N as shown in FIG. 24B. In some embodiments, the buried power line 102 may be connected to a second power having a second voltage (e.g., a source voltage $V_{SS}$), and thus the second power may be applied to the second bottom source/drain region 12_N. In some embodiments, each of the buried power line 102 and the buried power via 104 may include metal, for example, cobalt (Co), copper (Cu), and/or ruthenium (Ru). The buried insulating layer 106 may include various insulating materials, for example, silicon oxide. In some embodiments, the buried insulating layer 106 may directly contact the lower surface 100_L of the substrate 100 as shown in FIGS. 24A and 24B.

It will be understood that the INV1a may not include the third bottom contact 36_2a and the fourth bottom contact 36_2b of the INV1 shown in FIGS. 4, 5A, and 5B as a second power having a second voltage (e.g., a source voltage $V_{SS}$) may be applied to the second bottom source/drain region 12_N through the buried power line 102 and the buried power via 104. It will be also understood that that the second bottom source/drain region 12_N of the INV1a may have a width in the second horizontal direction Y less than that of the second bottom source/drain region 12_N of the INV1 shown in FIG. 4 as the second bottom source/drain region 12_N of the INV1a does not include portions onto which the third bottom contact 36_2a and the fourth bottom contact 36_2b land to contact the portions of the second bottom source/drain region 12_N.

Further, it will be understood that each of inverters and 2-input NANDs according to some embodiments of the present inventive concept (e.g., the INV2, the 2-NAND 1, the 2-NAND 2, the 2-NAND 3, the 2-NAND 4, and the 2-NAND 5) may include a buried power line 102, a buried power via 104, and a buried insulating layer 106, which are similar to or the same as the buried power line 102, the buried power via 104, and the buried insulating layer 106 of FIGS. 23, 24A, and 24B. A power (e.g., a power having a drain voltage $V_{DD}$ and a power having a source voltage $V_{SS}$) may be applied to a bottom source/drain region of each of inverters and 2-input NANDs according to some embodiments of the present inventive concept (e.g., the first bottom source/drain region 12_Pa, the second bottom source/drain region 12_N, the third bottom source/drain region 12_Pb, the first bottom source/drain region 12_Na, the second bottom source/drain region 12_P, and the third bottom source/drain region 12_Nb) through the buried power line 102 and the buried power via 104.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that references herein to "an element A vertically overlapping an element B" (or similar language) means that a vertical line intersecting both the elements A and B exists. It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A standard cell comprising:
   a first vertical field effect transistor (VFET) having a first conductivity type, wherein the first VFET comprises a first channel region protruding from a substrate in a vertical direction that is perpendicular to an upper surface of the substrate, and the first channel region has a first length in a first horizontal direction that is perpendicular to the vertical direction;
   a second VFET having a second conductivity type that is different from the first conductivity type, wherein the second VFET comprises a second channel region protruding from the substrate in the vertical direction, and the second channel region has a second length in the first horizontal direction; and
   a third VFET having the first conductivity type, wherein the third VFET comprises a third channel region protruding from the substrate in the vertical direction,
   wherein the first channel region, the second channel region, and the third channel region are spaced apart from each other in the first horizontal direction and are sequentially arranged along the first horizontal direction, and
   wherein the second length is greater than 1.5 times the first length.

2. The standard cell of claim 1, wherein the third channel region has a third length in the first horizontal direction, and the third length is equal to the first length.

3. The standard cell of claim 1, wherein the second length is greater than two times the first length.

4. The standard cell of claim 1, further comprising a common gate layer that comprises a first portion comprising a first gate electrode of the first VFET, a second portion comprising a second gate electrode of the second VFET, and a third portion comprising a third gate electrode of the third VFET.

5. The standard cell of claim 1, wherein the first VFET further comprises a first bottom source/drain region in the substrate, and the third VFET further comprises a third bottom source/drain region in the substrate, and
   wherein the first bottom source/drain region and the third bottom source/drain region are configured to be connected to a first power having a first voltage.

6. The standard cell of claim 1, further comprising:
   a first bottom contact extending along a first cell boundary adjacent the first VFET; and
   a second bottom contact extending along a second cell boundary adjacent the third VFET,
   wherein the first bottom contact and the second bottom contact are spaced apart from each other in the first horizontal direction and extend longitudinally in a second horizontal direction that is perpendicular to the vertical direction and traverses the first horizontal direction, and
   wherein the first bottom contact and the second bottom contact are configured to receive a first power having a first voltage.

7. The standard cell of claim 1, wherein the standard cell comprises a first cell boundary adjacent the first VFET, a second cell boundary adjacent the third VFET, and the first cell boundary and the second cell boundary are spaced apart from each other in the first horizontal direction, and
   wherein the second channel region comprises a portion that is equidistant from each of the first cell boundary and the second cell boundary in the first horizontal direction.

8. A standard cell comprising:
   a first vertical field effect transistor (VFET) comprising a first channel region protruding from a substrate in a vertical direction that is perpendicular to an upper surface of the substrate;
   a second VFET comprising a second channel region protruding from the substrate in the vertical direction; and
   a third VFET comprising a third channel region protruding from the substrate in the vertical direction,
   wherein the first channel region, the second channel region, and the third channel region are spaced apart from each other in a first horizontal direction that is perpendicular to the vertical direction and are sequentially arranged along the first horizontal direction,
   wherein the standard cell comprises a first cell boundary adjacent the first VFET, a second cell boundary adjacent the third VFET, and the first cell boundary and the second cell boundary are spaced apart from each other in the first horizontal direction, and
   wherein the second channel region comprises a portion that is equidistant from each of the first cell boundary and the second cell boundary in the first horizontal direction.

9. The standard cell of claim 8, further comprising
a first bottom contact extending along the first cell boundary; and
a second bottom contact extending along the second cell boundary,
wherein the first bottom contact and the second bottom contact are configured to receive a first power having a first voltage.

10. The standard cell of claim 9, wherein the first VFET further comprises a first bottom source/drain region in the substrate, and the third VFET further comprises a third bottom source/drain region in the substrate, and
wherein the first bottom contact is electrically connected to the first bottom source/drain region, and the second bottom contact is electrically connected to the third bottom source/drain region.

11. The standard cell of claim 9, wherein the second VFET further comprises a second bottom source/drain region in the substrate, and a second top source/drain region on the second channel region,
wherein the standard cell further comprises a conductive line electrically connected to the second top source/drain region, and
wherein the second top source/drain region is configured to receive a second power having a second voltage that is different from the first voltage.

12. The standard cell of claim 8, wherein the first channel region has a first length in the first horizontal direction, and the second channel region has a second length in the first horizontal direction, and
wherein the second length is greater than 1.5 times the first length.

13. The standard cell of claim 8, further comprising a common gate layer that comprises a first portion comprising a first gate electrode of the first VFET, a second portion comprising a second gate electrode of the second VFET, and a third portion comprising a third gate electrode of the third VFET.

14. A standard cell comprising:
a first vertical field effect transistor (VFET) comprising a first channel region protruding from a substrate in a vertical direction that is perpendicular to an upper surface of the substrate;
a second VFET comprising a second channel region protruding from the substrate in the vertical direction;
a third VFET comprising a third channel region protruding from the substrate in the vertical direction, wherein the first channel region, the second channel region, and the third channel region are spaced apart from each other in a first horizontal direction that is perpendicular to the vertical direction and are sequentially arranged along the first horizontal direction;
a first bottom contact adjacent the first VFET, wherein the first bottom contact extends along a first cell boundary and is electrically connected to the first VFET; and
a second bottom contact adjacent the third VFET, wherein the second bottom contact extends along a second cell boundary and is electrically connected to the third VFET,
wherein the first cell boundary and the second cell boundary are spaced apart from each other in the first horizontal direction, and
wherein the first bottom contact and the second bottom contact are configured to receive a first power having a first voltage.

15. The standard cell of claim 14, wherein the second VFET further comprises a second bottom source/drain region in the substrate, and a second top source/drain region on the second channel region,
wherein the standard cell further comprises a conductive line electrically connected to the second top source/drain region, and
wherein the second top source/drain region is configured to receive a second power having a second voltage that is different from the first voltage.

16. The standard cell of claim 14, wherein the first VFET further comprises a first bottom source/drain region in the substrate, and the third VFET further comprises a third bottom source/drain region in the substrate, and
wherein the first bottom contact is electrically connected to the first bottom source/drain region, and the second bottom contact is electrically connected to the third bottom source/drain region.

17. The standard cell of claim 14, wherein the first channel region has a first length in the first horizontal direction, and the second channel region has a second length in the first horizontal direction, and
wherein the second length is greater than 1.5 times the first length.

18. The standard cell of claim 17, wherein the third channel region has a third length in the first horizontal direction, and the third length is equal to the first length.

19. The standard cell of claim 14, further comprising a common gate layer that comprises a first portion comprising a first gate electrode of the first VFET, a second portion comprising a second gate electrode of the second VFET, and a third portion comprising a third gate electrode of the third VFET.

20. The standard cell of claim 19, each of the first VFET and the third VFET has a first conductivity type, and the second VFET has a second conductivity type that is different from the first conductivity type.

* * * * *